US006951666B2

(12) United States Patent
Kodas et al.

(10) Patent No.: US 6,951,666 B2
(45) Date of Patent: Oct. 4, 2005

(54) PRECURSOR COMPOSITIONS FOR THE DEPOSITION OF ELECTRICALLY CONDUCTIVE FEATURES

(75) Inventors: Toivo T. Kodas, Albuquerque, NM (US); Mark J. Hampden-Smith, Albuquerque, NM (US); Karel Vanheusden, Placitas, NM (US); Hugh Denham, Albuquerque, NM (US); Aaron D. Stump, Albuquerque, NM (US); Allen B. Schult, Albuquerque, NM (US); Paolina Atanassova, Albuquerque, NM (US); Klaus Kunze, Half Moon Bay, CA (US)

(73) Assignee: Cabot Corporation, Boston, MA (US)

( * ) Notice: Subject to any disclaimer, the term of this patent is extended or adjusted under 35 U.S.C. 154(b) by 0 days.

(21) Appl. No.: 10/265,296

(22) Filed: Oct. 4, 2002

(65) Prior Publication Data

US 2003/0124259 A1 Jul. 3, 2003

Related U.S. Application Data

(60) Provisional application No. 60/327,621, filed on Oct. 5, 2001, and provisional application No. 60/338,797, filed on Nov. 2, 2001.

(51) Int. Cl.$^7$ .............................................. B05D 3/02
(52) U.S. Cl. ................. 427/376.6; 427/125; 427/126.5; 427/282; 427/554
(58) Field of Search ............................. 427/376.1, 125, 427/126.5, 376.6, 383.1, 282, 554, 555

(56) References Cited

U.S. PATENT DOCUMENTS

| | | | |
|---|---|---|---|
| 3,313,632 A | 4/1967 | Langley et al. ............... 106/1 |
| 3,683,382 A | 8/1972 | Ballinger ..................... 346/74 |
| 4,122,062 A | 10/1978 | Monte et al. ............ 260/42.14 |
| 4,130,671 A | 12/1978 | Nagesh et al. .............. 427/125 |
| 4,186,244 A | 1/1980 | Deffeyes et al. ............ 428/570 |
| 4,211,668 A | 7/1980 | Tate ........................... 252/316 |
| 4,255,291 A | 3/1981 | Needes et al. ............. 252/578 |
| 4,289,534 A | 9/1981 | Deffeyes et al. .......... 106/1.14 |
| 4,333,966 A | 6/1982 | Deffeyes et al. ............. 427/96 |
| 4,381,945 A | 5/1983 | Nair ......................... 106/1.14 |
| 4,407,674 A | 10/1983 | Ehrreich ..................... 75/251 |
| 4,416,932 A | 11/1983 | Nair ........................... 428/209 |
| 4,419,383 A | 12/1983 | Lee ............................. 427/47 |
| 4,463,030 A | 7/1984 | Deffeyes et al. ............ 427/216 |
| 4,487,811 A | 12/1984 | Eichelberger et al. ...... 428/546 |
| 4,508,753 A | 4/1985 | Stepan ...................... 427/53.1 |
| 4,517,252 A | 5/1985 | Hugh ........................ 428/553 |
| 4,539,041 A | 9/1985 | Figlarz et al. ................ 75/0.5 |
| 4,548,879 A | 10/1985 | St. John et al. ............... 427/96 |
| 4,599,277 A | 7/1986 | Brownlow et al. ......... 428/552 |
| 4,650,108 A | 3/1987 | Gallagher ................... 228/124 |
| 4,668,533 A | 5/1987 | Miller ......................... 427/98 |
| 4,775,439 A | 10/1988 | Seeger, Jr. et al. ......... 156/231 |
| 4,808,274 A | 2/1989 | Nguyen ....................... 204/15 |
| 4,859,241 A | 8/1989 | Grundy .................... 106/1.14 |
| 4,891,242 A | 1/1990 | Ito et al. .................... 427/53.1 |
| 4,931,323 A | 6/1990 | Manitt et al. .............. 427/53.1 |
| 4,959,430 A | 9/1990 | Jonas et al. ................. 526/257 |
| 5,039,552 A | 8/1991 | Riemer ........................ 427/96 |
| 5,045,141 A | 9/1991 | Salensky et al. ............ 156/240 |
| 5,049,434 A | 9/1991 | Wasulko ..................... 428/202 |
| 5,057,363 A | 10/1991 | Nakanishi ................ 428/321.5 |
| 5,059,242 A | 10/1991 | Firmstone et al. ......... 106/1.23 |
| 5,075,262 A | 12/1991 | Nguyen et al. ............... 501/19 |
| 5,121,127 A | 6/1992 | Toriyama .................... 343/700 |
| 5,132,248 A | 7/1992 | Drummond et al. ........ 437/173 |
| 5,139,818 A | 8/1992 | Mance ....................... 427/54.1 |
| 5,153,023 A | 10/1992 | Orlowski et al. ........... 427/555 |
| 5,173,330 A | 12/1992 | Asano et al. ............... 427/558 |
| 5,176,744 A | * 1/1993 | Muller ....................... 106/1.26 |
| 5,183,784 A | 2/1993 | Nguyen et al. ............... 501/19 |
| 5,250,229 A | 10/1993 | Hara et al. .................. 252/518 |
| 5,270,368 A | 12/1993 | Lent et al. .................. 524/236 |
| 5,312,480 A | 5/1994 | Lotze et al. ............... 106/1.13 |

(Continued)

FOREIGN PATENT DOCUMENTS

| | | |
|---|---|---|
| EP | 1 323 793 | 7/2003 |
| JP | 62113164 | 5/1987 |
| JP | 2000-011875 | 1/2000 |
| JP | 2000-182889 | 6/2000 |
| WO | WO 98/37133 | 8/1998 |
| WO | WO 99/16556 | 4/1999 |
| WO | WO 99/16601 | 4/1999 |
| WO | WO 99/17352 | 4/1999 |
| WO | WO 00/29208 | 5/2000 |
| WO | WO 00/69235 | 11/2000 |
| WO | WO 01/54203 | 7/2001 |
| WO | WO 01/56736 A2 | 8/2001 |
| WO | WO 01/82315 | 11/2001 |
| WO | WO 01/87503 | 11/2001 |
| WO | WO 02/05294 | 1/2002 |
| WO | WO 03/038002 | 5/2003 |

OTHER PUBLICATIONS

ITT Cuts Costs of PC Board Manufacturing, Kenneth Dreyfack, Electronics, vol. 52, No. 17, (Aug. 16, 1979), no page numbers.

Ink Jet Printing of Hybrid Circuits, R.W. Vest, Tweedell and B.C. Buchanan, "Hybrid Microelectronics" 6, 261,267 (1983).

(Continued)

*Primary Examiner*—Bret Chen
(74) *Attorney, Agent, or Firm*—Marsh Fischmann & Breyfogle LLP

(57) ABSTRACT

A precursor composition for the deposition and formation of an electrical feature such as a conductive feature. The precursor composition advantageously has a viscosity of at least about 1000 centipoise and can be deposited by screen printing. The precursor composition also has a low conversion temperature, enabling the deposition and conversion to an electrical feature on low temperature substrates. A particularly preferred precursor composition includes silver and/or copper metal for the formation of highly conductive features.

33 Claims, No Drawings

U.S. PATENT DOCUMENTS

| | | | |
|---|---|---|---|
| 5,312,674 A | 5/1994 | Haertling et al. | 428/210 |
| 5,332,646 A | 7/1994 | Wright et al. | 430/137 |
| 5,366,760 A | 11/1994 | Fujii et al. | 427/96 |
| 5,378,408 A | 1/1995 | Carroll et al. | 252/514 |
| 5,378,508 A | 1/1995 | Castro et al. | 427/556 |
| 5,421,926 A | 6/1995 | Yukinobu et al. | 156/83 |
| 5,433,893 A | 7/1995 | Jost et al. | 252/514 |
| 5,444,453 A | 8/1995 | Lalezari | 343/700 |
| 5,463,057 A | 10/1995 | Graetzel et al. | 546/4 |
| 5,599,046 A | 2/1997 | Behm et al. | 283/83 |
| 5,601,638 A | 2/1997 | Fukuda et al. | 106/19 |
| 5,604,027 A | 2/1997 | Sheridon | 428/323 |
| 5,604,673 A | 2/1997 | Washburn et al. | 363/147 |
| 5,716,663 A | 2/1998 | Capote et al. | 427/96 |
| 5,767,810 A | 6/1998 | Hagiwara et al. | 343/700 |
| 5,781,158 A | 7/1998 | Ko et al. | 343/700 |
| 5,801,108 A | 9/1998 | Huang et al. | 501/32 |
| 5,826,329 A | 10/1998 | Roth | 29/846 |
| 5,828,271 A | 10/1998 | Stitzer | 333/24.1 |
| 5,846,615 A | 12/1998 | Sharma et al. | 427/597 |
| 5,882,722 A | 3/1999 | Kydd | 427/123 |
| 5,894,038 A | 4/1999 | Sharma et al. | 427/554 |
| 5,909,083 A | 6/1999 | Asano et al. | 313/584 |
| 5,930,026 A | 7/1999 | Jacobson et al. | 359/296 |
| 5,932,280 A | 8/1999 | Roth | 427/102 |
| 5,992,320 A | 11/1999 | Kosaka et al. | 101/401.1 |
| 5,997,044 A | 12/1999 | Behm et al. | 283/83 |
| 6,019,926 A | 2/2000 | Southward et al. | 264/216 |
| 6,027,762 A * | 2/2000 | Tomita et al. | 427/96 |
| 6,036,889 A * | 3/2000 | Kydd | 252/512 |
| 6,103,393 A | 8/2000 | Kodas et al. | 428/570 |
| 6,124,851 A | 9/2000 | Jacobson | 345/206 |
| 6,143,356 A | 11/2000 | Jablonski | 427/96 |
| 6,153,348 A | 11/2000 | Kydd et al. | 430/119 |
| 6,177,151 B1 | 1/2001 | Chrisey et al. | 427/596 |
| 6,197,366 B1 * | 3/2001 | Takamatsu | 427/125 |
| 6,200,405 B1 | 3/2001 | Nakazawa et al. | 156/248 |
| 6,207,268 B1 | 3/2001 | Kosaka et al. | 428/325 |
| 6,214,520 B1 | 4/2001 | Wolk et al. | 430/273.1 |
| 6,238,734 B1 | 5/2001 | Senzaki et al. | 427/226 |
| 6,274,412 B1 | 8/2001 | Kydd et al. | 438/149 |
| 6,294,401 B1 | 9/2001 | Jacobson et al. | 438/99 |
| 6,317,023 B1 | 11/2001 | Felten | 338/254 |
| 6,329,899 B1 | 12/2001 | Hunt et al. | 338/308 |
| 6,338,809 B1 | 1/2002 | Hampden-Smith et al. | 264/7 |
| 6,372,158 B1 | 4/2002 | Hashimoto et al. | 252/514 |
| 6,379,742 B1 | 4/2002 | Behm et al. | 427/7 |
| 6,379,745 B1 | 4/2002 | Kydd et al. | 427/96 |
| 6,395,053 B1 | 5/2002 | Fau et al. | 75/362 |
| 6,399,230 B1 | 6/2002 | Tormey et al. | 428/702 |
| 2002/0058143 A1 * | 5/2002 | Hunt et al. | 428/412 |
| 2002/0150678 A1 | 10/2002 | Cramer et al. | 427/212 |
| 2002/0151161 A1 | 10/2002 | Furusawa | 438/597 |
| 2003/0070569 A1 | 4/2003 | Bulthaup et al. | 101/127 |
| 2003/0073042 A1 | 4/2003 | Cernigliaro et al. | 430/321 |
| 2003/0082485 A1 | 5/2003 | Bulthaup et al. | 430/312 |
| 2003/0096056 A1 | 5/2003 | Kawamura et al. | 427/66 |
| 2003/0108664 A1 | 6/2003 | Kodas et al. | 427/125 |
| 2003/0148024 A1 | 8/2003 | Kodas et al. | 427/125 |
| 2003/0161959 A1 | 8/2003 | Kodas et al. | 427/376.2 |
| 2003/0175411 A1 | 9/2003 | Kodas et al. | 427/58 |
| 2003/0180451 A1 | 9/2003 | Kodas et al. | 427/123 |

OTHER PUBLICATIONS

Materials, Silver Ink for Jet Printing, NASA Tech Briefs, Aug. 1989. no page numbers.

Preparation of Colloidal Silver Dispersions by the Polyol Process Part 2—Mechanism of Particle Formation, Silvert et al. (J. Mater. Chem, 1997, 7(2), pp. 293–299).

"Advanced Materials Systems for Ultra–Low–Temperature, Digital, Direct–Write Technologies, Digital, Direct Write Technologies", Vanheusden et al.; in Direct–Write Technologies for Rapid Prototyping Applications, pp. 123–173 (Oct. 2001).

* cited by examiner

PRECURSOR COMPOSITIONS FOR THE DEPOSITION OF ELECTRICALLY CONDUCTIVE FEATURES

CROSS-REFERENCE TO RELATED APPLICATIONS

This application claims the benefit of U.S. Provisional Application No. 60/327,621 filed Oct. 5, 2001 and U.S. Provisional Patent Application No. 60/338,797 filed Nov. 2, 2001. The disclosure of each of these applications is incorporated herein by reference in its entirety.

BACKGROUND OF THE INVENTION

1. Field of the Invention

The present invention relates to precursor compositions that are useful for the deposition of conductive electronic features. The precursor compositions can advantageously have a low conversion temperature to enable low-temperature treatment of the precursors to form conductive features on a variety of substrates. The precursor compositions have a relatively high viscosity and can be deposited onto a substrate using methods such as thick-film deposition or syringe dispensing.

2. Description of Related Art

The electronics, display and energy industries rely on the formation of coatings and patterns of conductive materials to form circuits on organic and inorganic substrates. The primary methods for generating these patterns are screen printing for features larger than about 100 $\mu$m and thin film and etching methods for features having a feature size not greater than about 100 $\mu$m. Other subtractive methods to attain fine feature sizes include the use of photo-patternable pastes and laser trimming.

Another consideration with respect to patterning of conductors is cost. Non-vacuum, additive methods generally entail lower costs than vacuum and subtractive approaches. Some of these additive methods utilize high viscosity flowable liquids referred to as pastes. Screen-printing, for example, utilizes pastes with viscosities of thousands of centipoises. At the other extreme, low viscosity compositions can be deposited by methods such as ink jet printing.

The ideal starting material and printing technique for the fabrication of conductive features and coatings using high viscosity pastes would combine a number of attributes. The final conductor would have a high conductivity, preferably close to that of bulk silver or copper. When the conductor included a metal, the metal would be dense and pure. In cases where thermally sensitive substrates were required, the processing temperature would be low enough to allow the formation of conductors without damage to the organic substrates. The conductor would have high resistance to electromigration, solder leaching and oxidation. The methods and compositions would be capable of forming alloys with useful properties.

In the case of conductors derived from pastes containing combinations of molecular precursors and powders, a variety of criteria would be met. The deposited material would not spread or slump once deposited, thereby maintaining line width and thickness. The deposited paste would have a high yield of conductor. The deposit would adhere strongly to the substrate and would be compatible with the substrate and other materials in contact with the conductor. The deposit would be flexible and mechanically strong. In cases where ease of processing is most critical, UV curable compositions would be desirable.

Existing thick film conductor compositions cannot provide this combination of features. Polymer thick film compositions typically include a precursor to a polymer (e.g., an epoxy) and a conductive filler (e.g., silver) for conductive compositions. These pastes provide processing temperatures close to 100° C., but offer poor reliability and performance. Thin film techniques offer high reliability and high performance, but have a high cost and provide limited materials and geometries. Paste compositions including conductor particles that must be sintered require firing temperatures of 600° C. or higher, limiting their application to glass or ceramic substrates. Thus, there is a need for paste compositions that provide a combination of high performance, low processing temperature, and low cost.

U.S. Pat. Nos. 6,036,889 and 5,882,722 by Kydd disclose conductor precursor compositions that contain metallic particles, a precursor (metal organic composition compounds) and a vehicle that provide conductors at low temperatures on organic substrates.

For example, U.S. Pat. No. 6,036,889 discloses compositions including metal flakes having a thickness of about 1 $\mu$m.

U.S. Pat. No. 6,197,366 by Takamatsu discloses methods using inorganometallic compounds to obtain formulations that convert to dense solid metals at low temperatures.

Attempts have also been made to produce metal-containing compositions at low temperatures by using a composition containing a polymer and a precursor to a metal. See, for example, U.S. Pat. No. 6,019,926, by Southward et al. However, the deposits were chosen for optical properties and were either not conductive or poorly conductive.

U.S. Pat. Nos. 5,846,615 and 5,894,038, both by Sharma et al., discuss precursors to Au and Pd that have low reaction temperatures thereby conceptually enabling processing at low temperatures to form metals.

U.S. Pat. No. 5,176,744 by Muller discloses the use of Cu-formate precursor compositions for the direct laser writing of copper metal. The compositions include a crystallization inhibitor to prevent crystallization of Cu-formate during drying.

There exists a need for high viscosity precursor compositions for the fabrication of conductive features for use in electronics, displays, and other applications. Further, there is a need for precursor compositions that have low processing temperatures to allow deposition onto organic substrates and subsequent heat treatement, while still providing a feature with adequate electrical and mechanical properties. It would also be advantageous if the compositions could offer enhanced resolution control.

DESCRIPTION OF THE INVENTION

The present invention is directed to precursor compositions that can be deposited onto a surface using methods such as thick-film deposition. The precursor compositions preferably have a low decomposition temperature, thereby enabling the formation of electronically conductive features on a variety of substrates, including organic substrates. The compositions can include various combinations of molecular metal precursors, solvents, micron-sized particles, nanoparticles, vehicles, reducing agents and other additives. The precursor compositions can also include one or more conversion reaction inducing agents adapted to reduce the conversion temperature of the precursor composition. The precursor compositions can be deposited onto a substrate and reacted to form highly conductive features having good electrical and mechanical properties.

The precursor compositions according to the present invention can be formulated to have a wide range of properties and a wide range of relative cost. For example, in high volume applications that do not require well-controlled properties, inexpensive precursor compositions can be deposited on cellulose-based materials, such as paper, to form simple disposable circuits.

On the other hand, the precursor compositions of the present invention can be utilized to form complex, high precision circuitry having good electrical properties. The conductive features formed according to the present invention can have good electrical properties. For example, the conductive features fabricated according to the present invention can have a resistivity that is not greater than 20 times the resistivity of the bulk conductor, such as not greater than 10 times the resistivity of the bulk conductor, preferably not greater than 6 times the resistivity of the bulk conductor, more preferably not greater than 4 times the resistivity of the bulk conductor and even more preferably not greater than 2 times the resistivity of the bulk conductor.

The method for forming the conductive features according to the present invention can also use relatively low processing temperatures. In one embodiment, the conversion temperature is not greater than about 250° C., such as not greater than about 225° C., more preferably not greater than about 200° C. and even more preferably not greater than about 185° C. In certain preferred embodiments, the conversion temperature can be not greater than about 150° C., such as not greater than about 125° C. and even not greater than about 100° C. The heating time at the conversion temperature can also be very short, such as not greater than about 5 minutes, more preferably not greater than about 1 minute and even more preferably not greater than about 10 seconds.

Definitions

As used herein, the term precursor composition refers to a flowable composition that has a viscosity of at least about 1000 centipoise. Such compositions are also referred to as pastes. According to one embodiment, the high viscosity precursor composition has a viscosity of at least about 5000 centipoise, such as at least about 10,000 centipoise. As used herein, the viscosity is measured under the relevant deposition conditions. For example, some precursor compositions may be heated prior to and/or during deposition to reduce the viscosity.

As used herein, the term molecular metal precursor refers to a molecular compound that includes a metal atom. Examples include organometallics (molecules with carbon-metal bonds), metal organics (molecules containing organic ligands with metal bonds to other types of elements such as oxygen, nitrogen or sulfur) and inorganic compounds such as metal nitrates, metal halides and other metal salts.

In addition, the precursor compositions can include a solvent for the molecular metal precursor. A solvent is a chemical that is capable of dissolving at least a portion of the molecular metal precursor. In addition to the molecular metal precursors, the precursor composition can include particulates of one or several metals such as silver, metalloids such as silicon, conductive non-metals such as graphitic carbon, intrinsically conductive polymers, conductive metal oxides such as ZnO, or indium tin oxide (ITO), particulates of a molecular precursor or other material phases such as insulative $SiO_2$ particles. The particulates can fall in two size ranges referred to herein as nanoparticles and micron-sized particles. Nanoparticles have an average size of not greater than about 100 nanometers. Micron-sized particles have an average particle size of greater than about 0.1 μm. Nanoparticles and micron-sized particles are collectively referred to herein as particles or powders.

The precursor compositions can also include a vehicle. As used herein, a vehicle is a flowable medium that facilitates deposition of the precursor composition, such as by imparting sufficient flow properties to the precursor composition. As will be appreciated from the following discussion, the same chemical compound can have multiple functions in the precursor composition, such as one that is both a solvent and a vehicle.

Other materials, referred to herein simply as additives, can also be included in the precursor compositions of the present invention. As is discussed below, such additives can include, but are not limited to, crystallization inhibitors, polymers, polymer precursors (oligomers or monomers), reducing agents, binders, dispersants, surfactants, humectants, defoamers and the like.

As is discussed above, the precursor compositions according to the present invention typically include particulates in the form of micron-size particles and/or nanoparticles, unless a high-viscosity vehicle is used in which a molecular metal precursor is dissolved. The micron-size particles have an average size of at least about 0.1 μm.

Nanoparticles have an average size of not greater than about 100 nanometers, such as from about 10 to 80 nanometers. Particularly preferred are nanoparticles having an average size in the range from about 25 to 75 nanometers.

Nanoparticles that are particularly preferred for use in the present invention are not substantially agglomerated. Preferred nanoparticle compositions include $Al_2O_3$, $CuO_x$, $SiO_2$ and $TiO_2$, conductive metal oxides such as $In_2O_3$, indium-tin oxide (ITO) and antimony-tin oxide (ATO), silver, palladium, copper, gold, platinum and nickel. Other useful nanoparticles of metal oxides include pyrogenous silica such as HS-5 or M5 or others (Cabot Corp., Boston, Mass.) and AEROSIL 200 or others (Degussa AG, Dusseldorf, Germany) or surface modified silica such as TS530 or TS720 (Cabot Corp., Boston, Mass.) and AEROSIL 380 (Degussa AG, Dusseldorf, Germany). In one embodiment of the present invention, the nanoparticles are composed of the same metal that is contained in the metal precursor compound, discussed below. Nanoparticles can be fabricated using a number of methods and one preferred method, referred to as the Polyol process, is disclosed in U.S. Pat. No. 4,539,041 by Figlarz et al., which is incorporated herein by reference in its entirety.

Other particles that can be used in the present invention belong to the group of glass particles, preferably low melting point glass particles, and even more preferably conductive low melting point glass particles such as silver doped phosphate glasses.

A mixture of a high melting point metal powder such as Cu and a low-melting point metal powder can be formulated into a paste so that the low melting point powder melts and fills the voids between the high melting point metal particles.

Particulates can also be in the form of solid precursors to a conductive phase, such as $Ag_2O$ nanoparticles. An extensive list of precursors is disclosed below.

The shape of the particles can be varied from completely spherical such as those produced by spray pyrolysis to flakes that are leaf-like in shape with very large aspect ratios. Particles can also be any oblong shape in between spheres and flakes. When substantially spherical particles are described, the particle size refers to the particle diameter, when flakes are described the particle size refers to the largest dimension measure across such a particle. The presence of flakes can have an adverse effect on rheology and can result in clogging of the orifice of a deposition tool such as a syringe dispense tool. Hence, flake content, flake particle size, flake agglomeration, and surface morphology are all well controlled in the present invention. In one embodiment of the present invention, the precursor compositions do not include any flakes.

The compositions of the present invention can also include micron-size particles. Preferred compositions of micron-size particles are similar to the compositions described above with respect to nanoparticles.

Generally, the volume median particle size of the micron-size particles utilized in the low viscosity precursor compositions according to the present invention is at least about 0.1 $\mu$m, such as at least about 0.3 $\mu$m. Further, the volume median particle size is preferably not greater than about 20 $\mu$m. For most applications, the volume median particle size is more preferably not greater than about 10 $\mu$m and even more preferably is not greater than about 5 $\mu$m. A particularly preferred median particle size for the micron-size particles is from about 0.3 $\mu$m to about 3 $\mu$m. According to one embodiment of the present invention, it is preferred that the volume median particle size of the micron-size particles is at least 10 times smaller than the orifice diameter in the tool depositing the composition, such as not greater than about 5 $\mu$m for syringe-dispense device having a 50 $\mu$m orifice.

According to a preferred embodiment of the present invention, the particles (nanoparticles and micron-size particles) also have a narrow particle size distribution, such that the majority of particles are about the same size. This will ensure that there are a minimal number of large particles that can clog the mesh opening of a screen-printing tool or the channel in a syringe dispense tool. Preferably, at least about 70 volume percent and more preferably at least about 80 volume percent of the particles are not larger than twice the average particle size. For example, when the average particle size of micron-size particles is about 2 $\mu$m, it is preferred that at least about 70 volume percent of the micron-size particles are not larger than 4 $\mu$m and it is more preferred that at least about 80 volume percent of the micron-size particles are not larger than 4 $\mu$m. Further, it is preferred that at least about 70 volume percent and more preferably at least about 80 volume percent of the particles are not larger than about 1.5 times the average particle size. Thus, when the average particle size of the micron-size particles is about 2 $\mu$m, it is preferred that at least about 70 volume percent of the micron-size particles are not larger than 3 $\mu$m and it is more preferred that at least about 80 volume percent of the micron-size particles are not larger than 3 $\mu$m.

It is known that micron-size particles and nanoparticles often form soft agglomerates as a result of their relatively high surface energy, as compared to larger particles. It is also known that such soft agglomerates may be dispersed easily by treatments such as exposure to ultrasound in a liquid medium, sieving, high shear mixing and 3-roll milling. The average particle size and particle size distributions described herein are measured by mixing samples of the powders in a liquid medium, such as water and a surfactant, and exposing the suspension to ultrasound through either an ultrasonic bath or horn. The ultrasonic treatment supplies sufficient energy to disperse the soft agglomerates into primary particles. The primary particle size and size distribution are then measured by light scattering in a MICROTRAC instrument.

Thus, the references to particle size herein refer to the primary particle size, such as after lightly dispersing soft agglomerates of the particles.

It is also possible to provide micron-size particles or nanoparticles having a bimodal or trimodal particle size distribution. That is, the particles can have two distinct and different average particle sizes. Preferably, each of the distinct particle size distributions will meet the foregoing size distribution limitations. A bimodal particle size distribution can advantageously enhance the packing efficiency of the particles when deposited according to the present invention. The two modes can include particles of different composition. In one embodiment, the two modes have average particle sizes of about 1 $\mu$m and 5 $\mu$m, and in another embodiment the average particle size of the two modes are about 0.5 $\mu$m and 2.5 $\mu$m. The bimodal particle size distribution can also be achieved using nanoparticles and in another embodiment, the larger mode has an average particle size of 1 $\mu$m to 10 $\mu$m and the smaller mode has an average particle size of from about 10 to 100 nanometers.

The particles that are useful in the precursor compositions according to the present invention also preferably have a high degree of purity and it is preferred that the particles include not greater than about 1.0 atomic percent impurities and more preferably not greater than about 0.1 atomic percent impurities and even more preferably not greater than about 0.01 atomic percent impurities. Impurities are those materials that are not intended in the final product (i.e., the conductive feature) and that negatively affect the properties of the final product. For many electronically conductive features, the most critical impurities to avoid are Na, K, and Cl, S and F. As is discussed below, it will be appreciated that the particles can include composite particles having one or more second phases. Such second phases are not considered impurities.

The particles for use in the precursor compositions according to the present invention can also be coated particles wherein the particle includes a surface coating surrounding the particle core. Coatings can be generated on the particle surface by a number of different mechanisms. One preferred mechanism is spray pyrolysis. One or more coating precursors can vaporize and fuse to the hot particle surface and thermally react resulting in the formation of a thin film coating by chemical vapor deposition (CVD). Preferred coatings deposited by CVD include metal oxides and elemental metals. Further, the coating can be formed by physical vapor deposition (PVD) wherein a coating material physically deposits on the surface of the particles. Preferred coatings deposited by PVD include organic materials and elemental metals. Alternatively, a gaseous precursor can react in the gas phase forming small particles, for example, not greater than about 5 nanometers in size, which then diffuse to the larger particle surface and sinter onto the surface, thus forming a coating. This method is referred to as gas-to-particle conversion (GPC). Whether such coating reactions occur by CVD, PVD or GPC is dependent on the reactor conditions, such as temperature, precursor partial pressure, water partial pressure and the concentration of particles in the gas stream. Another possible surface coating method is surface conversion of the particles by reaction with a vapor phase reactant to convert the surface of the particles to a different material than that originally contained in the particles.

In addition, a volatile coating material such as lead oxide, molybdenum oxide or vanadium oxide can be introduced into the reactor such that the coating deposits on the particles by condensation. Further, the particles can be coated using other techniques. For example, soluble precursors to both the particle and the coating can be used in the precursor solution. In another embodiment, a colloidal precursor and a soluble precursor can be used to form a particulate colloidal coating on the composite particle. It will be appreciated that multiple coatings can be deposited on the surface of the particles if such multiple coatings are desirable.

The coatings are preferably as thin as possible while maintaining conformity about the particles such that the core of the particle is not substantially exposed. For example, the coatings on a micron-size particle can have an average thickness of not greater than about 200 nanometers, preferably not greater than about 100 nanometers and more preferably not more than about 50 nanometers. For most applications, the coating has an average thickness of at least about 5 nanometers.

For example, copper particles can be coated with another metal such as silver to stabilize the surface against oxidation during heat treatment of the precursor composition. Alternatively, silver particles can be coated with one or more metals such as copper or silver/palladium to increase the solder leach resistance while maintaining high conductivity. Another preferred example of a coated particle is a silver particle coated with a silica coating. This will prevent particle agglomeration during production and formulation into a precursor composition. The coating can act as a sintering delay barrier in certain specific applications. When formulated into a silver precursor composition, the silica coating can have a positive impact on composition flowability and the minimum feature size of the conductive features formed using this composition.

In addition to the foregoing, the particles can be coated after deposition of the composition onto the substrate by a molecular metal precursor contained in the precursor composition, such as a metallo-organic precursor. In this case, the coating will form during heat treatment of the composition.

Nanoparticles can also be coated with the coating strategies as described above. In addition, it may be advantageous to coat nanoparticles with materials such as a polymer, to prevent agglomeration of the nanoparticles due to high surface energy. This is described by P. Y. Silvert et al. (Preparation of colloidal silver dispersions by the polyol process, Journal of Material Chemistry, 1997, volume 7(2), pp. 293–299). In another embodiment, the particles can be coated with an intrinsically conductive polymer, preventing agglomeration in the composition and providing a conductive patch after solidification of the composition. In yet another embodiment, the polymer can decompose during heating enabling the nanoparticles to sinter together. In one embodiment, the nanoparticles are generated in-situ and are coated with a polymer. Preferred coatings for nanoparticles according to the present invention include a sulfonated perfluorohydrocarbon polymer suh as NAFION, polystyrene, polystyrene/methacrylate, polyvinyl pyrolidone, sodium bis(2-ethylhexyl) sulfosuccinate, tetra-n-octyl-ammonium bromide and alkane thiolates.

The particulates in accordance with the present invention can also be composite particles wherein the particles include a first phase and a second phase associated with the first phase. Preferred composite particulates include carbon-metal, carbon-polymer, carbon-ceramic, carbon1-carbon2, ceramic-ceramic, ceramic-metal, metal1-metal2, metal-polymer, ceramic-polymer, and polymer1-polymer2. Also preferred are certain 3-phase combinations such as metal-carbon-polymer. In one embodiment, the second phase is uniformly dispersed throughout the first phase. The second phase can be a conductive compound or it can be a non-conductive compound. For example, sintering inhibitors such as metal oxides can be included as a second phase in a first phase of a metallic material, such as silver metal to inhibit sintering of the metal without substantially affecting the conductivity.

The particulates according to a preferred embodiment of the present invention are also substantially spherical in shape. That is, the particulates are not jagged or irregular in shape. Spherical particles are particularly advantageous because they are able to disperse more readily in a precursor composition and impart advantageous flow characteristics to the precursor composition. For a given level of solids-loading, a precursor composition having spherical particles will have a lower viscosity than a composition having non-spherical particles. Spherical particles are also less abrasive than jagged particles.

Micron-size particles in accordance with the foregoing can be produced, for example, by spray pyrolysis. Spray pyrolysis for production of micron-size particles is described in U.S. Pat. No. 6,103,393 by Kodas, et al., which is incorporated herein by reference in its entirety.

The precursor compositions according to the present invention can also include molecular metal precursors to a metallic phase, either alone or in combination with particles. Preferred examples include precursors to silver (Ag), nickel (Ni), gold (Au), palladium (Pd), copper (Cu), indium (In) and tin (Sn). Other molecular metal precursors can include precursors to aluminum (Al), zinc (Zn), iron (Fe), tungsten (W), molybdenum (Mo), ruthenium (Ru), lead (Pb), bismuth (Bi) and similar metals. The molecular metal precursors can be either soluble or insoluble in the precursor composition. In general, molecular metal precursor compounds that eliminate ligands by a radical mechanism upon conversion to metal are preferred especially if the species formed are stable radicals and therefore lower the decomposition temperature of that precursor.

Furthermore, molecular metal precursors containing ligands that upon precursor conversion eliminate cleanly and escape completely from the substrate (or the formed functional structure) are preferred because they are not susceptible to carbon contamination or contamination by anionic species such as nitrates. Therefore, preferred precursors for metals used for conductors are carboxylates, alkoxides or combinations thereof that would convert to metals, metal oxides or mixed metal oxides by eliminating small molecules such as carboxylic acid anhydrides, ethers or esters. Metal carboxylates, particularly halogenocarboxylates such as fluorocarboxylates, are particularly preferred metal precursors due to their high solubility.

Silver has the lowest resistivity (about 1.59 $\mu\Omega$-cm) of any common metal and therefore is preferred for many applications. Examples of silver metal precursors that can be used in the precursor compositions according to the present invention are illustrated in Table 1.

TABLE 1

Silver Precursor Molecular Compounds

| General Class | Examples | Chemical Formula |
|---|---|---|
| Nitrates | Silver nitrate | $AgNO_3$ |
| Nitrites | Silver Nitrite | $AgNO_2$ |
| Oxides | Silver oxide | $Ag_2O, AgO$ |
| Carbonates | Silver carbonate | $Ag_2CO_3$ |
| Oxalates | Silver oxalate | $Ag_2C_2O_4$ |
| (Pyrazolyl)borates | Silver trispyrazolylborate | $Ag[(N_2C_3H_3)_3]BH$ |
| | Silver tris(dimethylpyrazolyl)borate | $Ag[((CH_3)_2N_2C_3H_3)_3]BH$ |
| Azides | Silver azide | $AgN_3$ |
| Fluoroborates | Silver tetrafluoroborate | $AgBF_4$ |
| Carboxylates | Silver acetate | $AgO_2CCH_3$ |
| | Silver propionate | $AgO_2CC_2H_5$ |
| | Silver butanoate | $AgO_2CC_3H_7$ |
| | Silver ethylbutyrate | $AgO_2CCH(C_2H_5)C_2H_5$ |
| | Silver pivalate | $AgO_2CC(CH_3)_3$ |
| | Silver cyclohexanebutyrate | $AgO_2C(CH_2)_3C_6H_{11}$ |
| | Silver ethylhexanoate | $AgO_2CCH(C_2H_5)C_4H_9$ |
| | Silver neodecanoate | $AgO_2CC_9H_{19}$ |
| Halogenocarboxylates | Silver trifluoroacetate | $AgO_2CCF_3$ |
| | Silver pentafluoropropionate | $AgO_2CC_2F_5$ |
| | Silver heptafluorobutyrate | $AgO_2CC_3F_7$ |
| | Silver trichloroacetate | $AgO_2CCCl_3$ |
| | Silver 6,6,7,7,8,8,8-heptafluoro-2,2-dimethyl-3,5-octanedionate | AgFOD |
| Hydroxycarboxylates | Silver lactate | $AgO_2CH(OH)CH_3$ |
| | Silver citrate | $Ag_3C_6H_5O_7$ |
| | Silver glycolate | $AgOOCCH(OH)CH_3$ |
| Aminocarboxylates | Silver glyconate | |
| Aromatic and nitro and/or fluoro substituted aromatic Carboxylates | Silver benzoate | $AgO_2CCH_2C_6H_5$ |
| | Silver phenylacetate | $AgOOCCH_2C_6H_5$ |
| | Silver nitrophenylacetates | $AgOOCCH_2C_6H_4NO_2$ |
| | Silver dinitrophenylacetate | $AgOOCCH_2C_6H_3(NO_2)_2$ |
| | Silver difluorophenylacetate | $AgOOCCH_2C_6H_3F_2$ |
| | Silver 2-fluoro-5-nitrobenzoate | $AgOOCC_6H_3(NO_2)F$ |
| Beta diketonates | Silver acetylacetonate | $Ag[CH_3COCH=C(O—)CH_3]$ |
| | Silver hexafluoroacetylacetonate | $Ag[CF_3COCH=C(O—)CF_3]$ |
| | Silver trifluoroacetylacetonate | $Ag[CH_3COCH=C(O—)CF_3]$ |
| Silver sulfonates | Silver tosylate | $AgO_3SC_6H_4CH_3$ |
| | Silver triflate | $AgO_3SCF_3$ |

In addition to the foregoing, complex silver salts containing neutral inorganic or organic ligands can also be used as molecular precursors. These salts are usually in the form of nitrates, halides, perchlorates, hydroxides or tetrafluoroborates. Examples are listed in Table 2.

TABLE 2

Complex Silver Salt Precursors

| Class | Examples (Cation) |
|---|---|
| Amines | $[Ag(RNH_2)_2]^+$, $[Ag(R_2NH)_2]^+$, $[Ag(R_3N)_2]^+$, R = aliphatic or aromatic |
| N-Heterocycles | $[Ag(L)_x]^+$, (L = aziridine, pyrrol, indol, piperidine, pyridine, aliphatic substituted and amino substituted pyridines, imidazole, pyrimidine, piperazine, triazoles, etc.) |
| Amino alcohols | $[Ag(L)_x]^+$, L = Ethanolamine |
| Amino acids | $[Ag(L)_x]^+$, L = Glycine |
| Acid amides | $[Ag(L)_x]^+$, L = Formamides, acetamides |
| Nitriles | $[Ag(L)_x]^+$, L = Acetonitriles |

The molecular metal precursors can be utilized in an aqueous-based solvent or an organic solvent. Preferred molecular metal precursors for silver in an organic solvent include Ag-nitrate, Ag-neodecanoate, Ag-trifluoroacetate Ag-acetate, Ag-lactate, Ag-cyclohexanebutyrate, Ag-carbonate, Ag-oxide, Ag-ethylhexanoate, Ag-acetylacetonate, Ag-ethylbutyrate, Ag-pentafluoropropionate, Ag-benzoate, Ag-citrate, Ag-heptafluorobutyrate, Ag-salicylate, Ag-decanoate and Ag-glycolate. Among the foregoing, particularly preferred molecular metal precursors for silver include Ag-acetate, Ag-nitrate, Ag-trifluoroacetate and Ag-neodecanoate. Most preferred among the foregoing silver precursors are Ag-trifluoroacetate and Ag-acetate. The preferred precursors generally have a high solubility and high metal yield. For example, Ag-trifluoroacetate has a solubility in dimethylacetamide of about 78 wt. % and Ag-trifluoroacetate is a particularly preferred silver precursor according to the present invention.

Preferred molecular silver precursors for aqueous-based solvents include Ag-nitrates, Ag-fluorides such as silver fluoride or silver hydrogen fluoride ($AgHF_2$), Ag-thiosulfate, Ag-trifluoroacetate and soluble diammine complexes of silver salts.

Silver precursors in solid form that decompose at a low temperature, such as not greater than about 200° C., can also be used. Examples include Ag-oxide, Ag-nitrite, Ag-carbonate, Ag-lactate, Ag-sulfite and Ag-citrate.

When a more volatile molecular silver precursor is desired, the precursor can be selected from alkene silver betadiketonates, $R_2(CH)_2Ag([R'COCH=C(O—)CR"]$ where R=methyl or ethyl and R', R"=$CF_3$, $C_2F_5$, $C_3F_7$, $CH_3$, $C_mH_{2m+1}$ (m=2 to 4), or trialkylphosphine and tri-arylphosphine derivatives of silver carboxylates, silver beta diketonates or silver cyclopentadienides.

Molecular metal precursors for nickel that are preferred according to the present invention are illustrated in Table 3. A particularly preferred nickel precursor for use with an aqueous-based solvent is Ni-acetylacetonate.

TABLE 3

Molecular Precursors for Nickel

| General Class | Example | Chemical Formula |
|---|---|---|
| Inorganic Salts | Ni-nitrate | $Ni(NO_3)_2$ |
| | Ni-sulfate | $NiSO_4$ |
| | Nickel ammine complexes | $[Ni(NH_3)_6]^{n+}$ (n = 2, 3) |
| | Ni-tetrafluoroborate | $Ni(BF_4)_2$ |
| Metal Organics Alkoxides, Beta-diketonates, Carboxylates, Fluorocarboxylates | Ni-oxalate | |
| | Ni-isopropoxide | $Ni(OC_3H_7)_2$ |
| | Ni-methoxyethoxide | $Ni(OCH_2CH_2OCH_3)_2$ |
| | Ni-acetylacetonate | $[Ni(acac)_2]_3$ or $Ni(acac)_2(H_2O)_2$ |
| | Ni hexafluoro-acetylacetonate | $Ni[CF_3COCH=C(O—)CF_3]_2$ |
| | Ni-formate | $Ni(O_2CH)_2$ |
| | Ni-acetate | $Ni(O_2CCH_3)_2$ |
| | Ni-octanoate | $Ni(O_2CC_7H_{15})_2$ |
| | Ni-ethylhexanoate | $Ni(O_2CCH(C_2H_5)C_4H_9)_2$ |
| | Ni-trifluoroacetate | $Ni(OOCCF_3)_2$ |

Various molecular precursors can be used for platinum metal. Preferred molecular precursors include ammonium salts of platinates such as ammonium hexachloro platinate $(NH_4)_2PtCl_6$, and ammonium tetrachloro platinate $(NH_4)_2PtCl_4$; sodium and potassium salts of halogeno, pseudohalogeno or nitrito platinates such as potassium hexachloro platinate $K_2PtCl_6$, sodium tetrachloro platinate $Na_2PtCl_4$, potassium hexabromo platinate $K_2PtBr_6$, potassium tetranitrito platinate $K_2Pt(NO_2)_4$; dihydrogen salts of hydroxo or halogeno platinates such as hexachloro platinic acid $H_2PtCl_6$, hexabromo platinic acid $H_2PtBr_6$, dihydrogen hexahydroxo platinate $H_2Pt(OH)_6$; diammine and tetraammine platinum compounds such as diammine platinum chloride $Pt(NH_3)_2Cl_2$, tetraammine platinum chloride $[Pt(NH_3)_4]Cl_2$, tetraammine platinum hydroxide $[Pt(NH_3)_4](OH)_2$, tetraammine platinum nitrite $[Pt(NH_3)_4](NO_2)_2$, tetrammine platinum nitrate $Pt(NH_3)_4(NO_3)_2$, tetrammine platinum bicarbonate $[Pt(NH_3)_4](HCO_3)_2$, tetraammine platinum tetrachloroplatinate $[Pt(NH_3)_4]PtCl_4$; platinum diketonates such as platinum (II) 2,4-pentanedionate $Pt(C_5H_7O_2)_2$; platinum nitrates such as dihydrogen hexahydroxo platinate $H_2Pt(OH)_6$ acidified with nitric acid; other platinum salts such as Pt-sulfite and Pt-oxalate; and platinum salts comprising other N-donor ligands such as $[Pt(CN)_6]^{4+}$.

Platinum precursors useful in organic-based precursor compositions include Pt-carboxylates or mixed carboxylates. Examples of carboxylates include Pt-formate, Pt-acetate, Pt-propionate, Pt-benzoate, Pt-stearate, Pt-neodecanoate. Other precursors useful in organic vehicles include aminoorgano platinum compounds including Pt(diaminopropane)(ethylhexanoate).

Preferred combinations of platinum precursors and solvents include: $PtCl_4$ in $H_2O$; Pt-nitrate solution from $H_2Pt(OH)_6$; $H_2Pt(OH)_6$ in $H_2O$; $H_2PtCl_6$ in $H_2O$; and $[Pt(NH_3)_4](NO_3)_2$ in $H_2O$.

Gold precursors that are particularly useful for aqueous based precursor compositions include Au-chloride ($AuCl_3$) and tetrachloric auric acid ($HAuCl_4$).

Gold precursors useful for organic based formulations include: Au-thiolates, Au-carboxylates such as Au-acetate $Au(O_2CCH_3)_3$; aminoorgano gold carboxylates such as imidazole gold ethylhexanoate; mixed gold carboxylates such as gold hydroxide acetate isobutyrate; Au-thiocarboxylates and Au-dithiocarboxylates.

In general, preferred gold molecular metal precursors for low temperature conversion are compounds comprising a set of different ligands such as mixed carboxylates or mixed alkoxo metal carboxylates. As one example, gold acetate isobutyrate hydroxide decomposes at 155° C., a lower temperature than gold acetate. As another example, gold acetate neodecanoate hydroxide decomposes to gold metal at an even lower temperature (125° C.). Still other examples can be selected from gold acetate trifluoroacetate hydroxide, gold bis(trifluoroacetate) hydroxide and gold acetate pivalate hydroxide.

Other useful gold precursors include Au-azide and Au-isocyanide. When a more volatile molecular gold precursor is desired, such as for spray deposition, the precursor can be selected from dialkyl and monoalkyl gold carboxylates, $R_{3-n}Au(O_2CR')_n$ (n=1,2)

R=methyl, ethyl; R'=$CF_3$, $C_2F_5$, $C_3F_7$, $CH_3$, $C_mH_{2m+1}$ (m=2-9)

dialkyl and monoalkyl gold beta diketonates, $R_{3-n}Au[R'COCH=C(O—)CR"]_n$ (n=1,2), R=methyl, ethyl; R', R"=$CF_3$, $C_2F_5$, $C_3F_7$, $CH_3$, $C_mH_{2m+1}$ (m=2-4)

dialkyl and monoalkyl gold alkoxides, $R_{3-n}Au(OR')_n$ (n=1,2)

R=methyl, ethyl; R"=$CF_3$, $C_2F_5$, $C_3F_7$, $CH_3$, $C_mH_{2m+1}$ (m=2-4), $SiR_3"$ (R"=methyl, ethyl, propyl, isopropyl, n-butyl, isobutyl, tert. Butyl) phosphine gold complexes:

RAu(PR'$_3$) R, R'=methyl, ethyl, propyl, isopropyl, n-butyl, isobutyl, tert. Butyl, $R_3Au(PR'_3)$ R, R'=methyl, ethyl, propyl, isopropyl, n-butyl, isobutyl, tert. butyl.

Particularly useful molecular precursors to palladium for organic based precursor compositions according to the present invention include Pd-carboxylates, including Pd-fluorocarboxylates such as Pd-acetate, Pd-propionate, Pd-ethylhexanoate, Pd-neodecanoate and Pd-trifluoroacetate as well as mixed carboxylates such as Pd(OOCH)(OAc), Pd(OAc)(ethylhexanoate), Pd(ethylhexanoate)$_2$, Pd(OOCH)$_{1.5}$ (ethylhexanoate)$_{0.5}$, Pd(OOCH)(ethylhexanoate), Pd(OOCCH(OH)CH(OH)COOH)$_m$ (ethylhexanoate), Pd(OPr)$_2$, Pd(OAc)(OPr), Pd-oxalate, Pd(OOCCHO)$_m$(OOCCH$_2$OH)$_n$=(Glyoxilic palladium glycolate and Pd-alkoxides. A particularly preferred palladium precursor is Pd-trifluoroacetate. Molecular palladium precursors useful for aqueous based precursor compositions include: tetraammine palladium hydroxide [Pd(NH$_3$)$_4$](OH)$_2$; Pd-nitrate Pd(NO$_3$)$_2$; Pd-oxalate Pd(O$_2$CCO$_2$)$_2$; Pd-chloride PdCl$_2$; Di- and tetraammine palladium chlorides, hydroxides or nitrates such as tetraammine palladium chloride [Pd(NH$_3$)$_4$]Cl$_2$, tetraammine palladium hydroxide [Pd(NH$_3$)$_4$](OH)$_2$, tetraammine palladium nitrate [Pd(NH$_3$)$_4$](NO$_3$)$_2$, diammine palladium nitrate [Pd(NH$_3$)$_2$](NO$_3$)$_2$ and tetraammine palladium tetrachloropalladate [Pd(NH$_3$)$_4$][PdCl$_4$].

When selecting a molecular copper precursor compound, it is desired that the compound react during processing to metallic copper without the formation of copper oxide or other species that are detrimental to the conductivity of the conductive copper feature. Some copper molecular precursors form copper by thermal decomposition at elevated temperatures. Other molecular copper precursors require a reducing agent to convert to copper metal. The introduction of the reducing agent can occur in the form of a chemical agent (e.g., formic acid) that is soluble in the precursor composition to afford a reduction to copper either during transport to the substrate or on the substrate. In some cases, the ligand of the molecular copper precursor has reducing characteristics, such as in Cu-formate or Cu-hypophosphite, leading to reduction to copper metal. However, formation of metallic copper or other undesired side reactions that occur prematurely in the ink or precursor composition should be avoided.

Accordingly, the ligand can be an important factor in the selection of suitable copper molecular precursors. During thermal decomposition or reduction of the precursor, the ligand needs to leave the system cleanly, preferably without the formation of carbon or other residues incorporated into the copper feature. Copper precursors containing inorganic ligands are preferred in cases where carbon contamination is detrimental. Other desired characteristics for molecular copper precursors are low decomposition temperature or processing temperature for reduction to copper metal, high solubility in the selected solvent/vehicle to increase metallic yield and achieve dense features and the compound should be environmentally benign.

Preferred molecular metal precursors for copper according to the present invention include Cu-formate and Cu-neodecanoate. Molecular copper precursors that are useful for aqueous-based precursor compositions include: Cu-nitrate and ammine complexes thereof; Cu-carboxylates including Cu-formate and Cu-acetate; and Cu beta-diketonates such as Cu-hexafluoroacetylacetonate and copper salts such as Cu-chloride.

Molecular copper precursors generally useful for organic based compositions include: Cu-carboxylates and Cu-fluorocarboxylates such as: Cu-formate, Cu-ethylhexanoate; Cu-neodecanoate; Cu-methacrylate; Cu-trifluoroacetate; Cu-hexanoate; and copper beta-diketonates such as cyclooctadiene Cu-hexafluoroacetylacetonate.

Among the foregoing, Cu-formate is particularly preferred as it is highly soluble in water and results in the in-situ formation of formic acid, which is an effective reducing agent.

One method for reducing the conversion temperature of the precursor composition is by in-situ generation of molecular metal precursor by reaction of ligands with particles. For example, silver oxide can be a starting material and can be incorporated into high viscosity precursor compositions, preferably in the form of nanoparticles. This can also reduce the cost associated with the precursor composition as compared to other molecular metal precursors.

Silver oxide does not reduce to silver at low temperatures by itself. However, when the oxide is allowed to react with an organic acid such as neodecanoic acid or trifluoroacetic acid, the reduction to pure silver can be accomplished at a reduced temperature. The reduction is preferentially carried out in the presence of a reaction inducing agent such as alpha terpineol. The silver oxide can react with deprotonateable organic compounds to form the corresponding silver salts. For example, silver oxide can be mixed with a carboxylic acid to form silver carboxylate. Preferred carboxylic acids include acetic acid, neodecanoic acid and trifluoroacetic acid. Other carboxylic acids can work as well. For example, DARVAN C (R. T. Vanderbilt Company, Norwalk, Conn.) is sometimes included in formulation as a rheology modifier and the carboxylic function of this additive can react with the metal oxide.

Further, it will be appreciated that small silver particles that are coated with a thin silver oxide layer can be reacted with these compounds. Such a surface modification can advantageously lead to improved particle loadings in the precursor compositions. Another example is the reaction of copper oxide coated silver powder with carboxylic acids. This procedure can be generally applied to other materials such as palladium oxide and nickel oxide. Other deprotonateable compounds are halogeno-, hydroxy- and other alkyl and aryl derivatives of carboxylic acids, beta diketones, and acidic alcohols such as phenol and hydrogen tetrafluoroborates.

Silver oxide, silver acetate and silver nitrate also have a high metal yield when used as precursors.

As is discussed above, two or more molecular metal precursors can be combined to form metal alloys and/or metal compounds. Preferred combinations of metal precursors to form alloys based on silver include: Ag-nitrate and Pd-nitrate; Ag-acetate and $[Pd(NH_3)_4](OH)_2$; Ag-trifluoroacetate and $[Pd(NH_3)_4](OH)_2$; and Ag-neodecanoate and Pd-neodecanoate. One particularly preferred combination of molecular precursors is Ag-trifluoroacetate and Pd-trifluoroacetate. Another preferred alloy is Ag/Cu.

To form alloys, the two (or more) molecular metal precursors should have similar decomposition temperatures to avoid the formation of one of the metal species before the other species. Preferably, the decomposition temperatures of the different molecular precursors are within about 50° C., more preferably within about 25° C.

Some applications require the utilization of a transparent or semi-transparent conductive feature. For example, indium tin oxide (ITO) is useful for the formation of transparent conductive features, such as for use in display applications. Antimony tin oxide (ATO) is useful as a color tunable oxide layer that finds use in electrochromic applications.

Such transparent conductive features can also be fabricated according to the present invention. For ITO, useful molecular precursors for indium include: In-nitrate; In-chloride; In-carboxylates such as In-acetate; In-propionates including fluoro, chloro or bromo derivatives thereof; beta diketonates such as In-acetylacetonate, In-hexafluoroacetylacetonate and In-trifluoroacetylacetonate; pyrazolyl borohydrides such as $In(pz)_3BH$; In-alkoxides and In-fluoroalkoxides; and In-amides. Mixed alkoxo In-carboxylates such as indium isopropoxide ethylhexanoate are also useful.

Useful molecular precursors for tin in ITO or ATO include: Sn-halides such as Sn-tetrachloride; Sn-dichloride; Sn-carboxylates such as Sn-acetate or Sn-ethylhexanoate; Sn-alkoxides such as $Sn(O^tBu)_4$; Sn-hydroxycarboxylates such as Sn-glycolate; and beta diketonates such as Sn-hexafluoroacetylacetonate.

Useful molecular precursors for antimony include: Sb-trichloride; antimony carboxylates such as Sb-acetate or Sb-neodecanoate; antimony alkoxides such as Sb-methoxide, Sb-ethoxide, Sb-butoxide.

The precursor compositions according to the present invention can also include a solvent capable of solubilizing the molecular metal precursor discussed above. A precursor composition typically includes a molecular metal precursor, particles, a vehicle and other additives such as surfactants and rheology additives. The solvent can be water thereby forming an aqueous-based precursor composition. Water is more environmentally acceptable as compared to organic solvents. However, water cannot typically be used for deposition of the precursor composition onto hydrophobic substrates, such as tetrafluoroethylene fluorocarbon substrates (e.g., Teflon, E. I. duPont deNemours, Wilmington, Del.), without some modification of the substrate or the aqueous composition.

The solvent can also include an organic solvent, by itself or in addition to water. The selected solvent should be capable of solubilizing the selected molecular metal precursor to a high level. A low solubility of the molecular metal precursor in the solvent can lead to low yields of the conductor, thin deposits and low conductivity. The precursor compositions of the present invention exploit certain combinations of solvents and molecular metal precursors that advantageously provide high molecular metal precursor solubility while still allowing relatively low temperature conversion of the precursor to the conductor.

According to one embodiment of the present invention, the molecular metal precursor preferably has a solubility in the solvent of at least about 20 weight percent, more preferably at least 40 weight percent, even more preferably at least about 50 weight percent and most preferably at least about 60 weight percent. Such high levels of metal precursor lead to increased metal yield and the ability to deposit features having adequate thickness.

In some cases, the solvent can be a high melting point solvent, such as one having a melting point of at least about 30° C. and not greater than about 100° C. In this embodiment, the precursor composition can be heated during deposition while in a flowable state whereby the solvent solidifies upon contacting the substrate. Subsequent processing can then remove the solvent by other means and then convert the material to the final product, thereby retaining resolution. Preferred solvents according to this embodiment are waxes, high molecular weight fatty acids, alcohols, acetone, NMP, toluene, tetrahydrofuran and the like.

The solvent can also be a low melting point solvent. A low melting point solvent is required when the precursor composition must remain viscous on the substrate until dried. A preferred low melting point solvent according to this embodiment is DMAc, which has a melting point of about −20° C.

In addition, the solvent can be a low vapor pressure solvent. A lower vapor pressure advantageously prolongs the work life of the precursor composition in cases where evaporation leads to problems such as clogging. A preferred solvent according to this embodiment is terpineol. Other low vapor pressure solvents include diethylene glycol, ethylene glycol, hexylene glycol, NMP, and tri(ethylene glycol) dimethyl ether.

The solvent can also be a high vapor pressure solvent, such as one having a vapor pressure of at least about 1 kPa. A high vapor pressure allows simple removal of the solvent by drying. Other high vapor pressure solvents include acetone, tetrahydrofuran, toluene, xylene, ethanol, methanol, 2-butanone and water.

The solvents can be polar or non-polar. Solvents that are useful according to the present invention include amines, amides, alcohols, water, ketones, unsaturated hydrocarbons, saturated hydrocarbons, mineral acids organic acids and bases, Preferred solvents include alcohols, amines, amides, water, ketone, ether, aldehydes and alkenes. Particularly preferred organic solvents according to the present invention for use with metal carboxylate compounds include N,N-dimethyacetamide (DMAc), diethyleneglycol butylether (DEGBE), ethanolamine and N-methyl pyrrolidone.

The solvent can also be a monomer that converts to a polymer when exposed to ultraviolet radiation immediately after deposition onto the substrate.

As is discussed above, a vehicle is a flowable medium that facilitates the deposition of the precursor composition. In cases where the liquid serves only to carry particles and to dissolve molecular species, the terminology of the vehicle is often used for the liquid. However, in many precursor compositions, the solvent can also be considered the vehicle. The metal such as silver can be bound to the vehicle; for example, by synthesizing a silver derivative of terpineol that simultaneously acts as both a precursor to silver and as a vehicle. This improves the metallic yield and reduces the porosity of the conductive feature.

Examples of preferred vehicles are listed in Table 4. Particularly preferred vehicles according to the present invention include alpha terpineol, toluene, ethylene glycol.

TABLE 4

Organic Vehicles Useful in Precursor Compositions

| Formula/Class | Name |
| --- | --- |
| Alcohols | 2-Octanol |
| | Benzyl alcohol |
| | 4-hydroxy-3methoxy benzaldehyde |
| | Isodeconol |
| | Butylcarbitol |
| Terpene alcohol | Alpha terpineol |
| | Beta-terpineol |
| | Cineol |
| Esters | 2,2,4 trimethylpentanediol-1,3 monoisobutyrate |
| | Butyl carbitol acetate |
| | Butyl oxalate |
| | Dibutyl phthalate |
| | Dibutyl benzoate |
| | Butyl cellosolve acetate |
| | Ethylene glycol diacetate |
| | Ethylene glycol diacetate |
| | N-methyl-2-pyrolidone |
| Amides | N,N-dimethyl formamide |
| | N,N-dimethyl acetamide |
| Aromatics | Xylenes |
| | Aromasol |
| Substituted aromatics | Nitrobenzene |
| | o-nitrotoluene |
| Terpenes | Alpha-pinene, beta-pinene, dipentene, dipentene oxide |
| Essential Oils | Rosemary, lavender, fennel, sassafras, wintergreen, anise oils, camphor, turpentine |

The precursor compositions in accordance with the present invention can also include one or more polymers. When polymers are included in the compositions, the polymer preferably constitutes not greater than about 35 volume percent, more preferably not greater than about 20 volume percent of the volume of the final conductive material, after drying and processing of the precursor composition into a conductive feature. It will be appreciated that this type of formulation is substantially different from what is known in the art as polymer thick film. The formulations of the present invention typically contain precursors and nanoparticles, or at least one thereof. In contrast, polymer thick film formulations do nt contain any precursors to a conductive metal, nor do polymer thick film formulations typically contain nanoparticulates of a precursor or a metal. The polymers can be thermoplastic polymers or thermoset polymers. Thermoplastic polymers are characterized by being fully polymerized. They do not take part in any reactions to further polymerize or cross-link to form a final product. Typically, such thermoplastic polymers are melt-cast, injection molded or dissolved in a solvent. Examples include polyimide films, ABS plastics, vinyl, acrylic, styrene polymers of medium or high molecular weight, and the like.

The polymers can also be thermoset polymers, which are characterized by not being fully polymerized or cured. The components that make up thermoset polymers must undergo further reactions to form fully polymerized, cross-linked or dense final products. Thermoset polymers tend to be resistant to solvents, heat, moisture and light.

A typical thermoset polymer mixture initially includes a monomer, resin or low molecular weight polymer. These components require heat, hardeners, light or a combination of the three to fully polymerize. Hardeners can be used to speed the polymerization reactions. Some thermoset polymer systems are two part epoxies that are mixed at consumption or are mixed, stored and used as needed.

Specific examples of thermoset polymers include amine or amide-based epoxies such as diethylenetriamine, polyglycoldianine and triethylenetetramine. Other examples include imidazole, aromatic epoxies, brominated epoxies, thermoset PET, phenolic resins such as bisphenol-A, polymide, acrylics, urethanes, and silicones. Hardeners can include isophoronediamine and meta-phenylenediamene.

The polymer can also be an ultraviolet or other light-curable polymer. The polymers in this category are typically UV and light-curable materials that require photoinitiators to initiate the cure. Light energy is absorbed by the photoinitiators in the formulation causing them to fragment into reactive species, which can polymerize or cross-link with other components in the formulation. In acrylate-based adhesives, the reactive species formed in the initiation step are known as free radicals. Another type of photoinitiator, a cationic salt, is used to polymerize epoxy functional resins generating an acid, which reacts to create the cure. Examples of these polymers include cyanoacrylates such as z-cyanoacrylic acid methyl ester with an initiator as well as typical epoxy resin with a cationic salt.

The polymers can also be conductive polymers such as intrinsically conductive polymers. Conductive polymers are disclosed, for example, in U.S. Pat. No. 4,959,430 by Jonas et al., which is incorporated herein by reference in its entirety. Other examples of intrinsically conductive polymers are listed in Table 5 below.

TABLE 5

Intrinsically Conductive Polymers

| Examples | Class/Monomers | Catalyst/Dopant |
|---|---|---|
| | Polyacetylene | |
| Poly[bis(benzylthio)acetylene] | Phyenyl vinyl sulfoxide | Ti alkylidene |
| Poly[bis(ethylthio)acetylene] | | |
| Poly[bis(methylthio)acetylene] | 1,3,5,7-Cyclooctatetraene | |
| | Polyaniline | |
| Fully reduced | | organic sulfonic acids such as: |
| Half oxidized | | Dinonylnaphthalenedisulfonc acid |
| | | Dinonylnaphthaleneusulfonic acid |
| | | Dodecylbenzenesulfonic acid |
| | Poly(anilinesulfonic acid) | |
| Self-doped state | | |
| | Polypyrrole | |
| | | Organic sulfonic acid |
| | Polythiophene | |
| Poly(thiophine-2.5-diyl) | 2,5-Dibromo-3-alkyl/arylthiophene | |
| Poly(3-alkylthiophene-2.5-diyl) alkyl = butyl, hexyl, octyl, decyl, dodecyl | alkyl = butyl, hexyl, octyl, decyl, dodecyl | |
| | aryl = phenyl | |
| Poly(styrenesulfonate)/poly-(2,3-dihydrothieno-[3,4-b]-1,4-dioxin) | Dibromodithiophene Terthiophene Other substituted thiophenes | |
| | Poly(1,4-phenylenevinylene) (PPV) | |
| | p-Xylylenebis (tetrahydrothiopheniumchloride)) Poly(1,4-phenylene sulfide) Poly(fluroenyleneethynylene) | |

Other additives can be included in the precursor compositions in accordance with the present invention. Among these are reducing agents to prevent the undesirable oxidation of metal species. For example, copper and nickel metal have a strong tendency to oxidize. Reducing agents are materials that are oxidized, thereby causing the reduction of another substance. The reducing agent loses one or more electrons and is referred to as having been oxidized. Precursor compositions to base metals, including nickel or copper, according to the present invention can include reducing agents as additives to provide reaction conditions for the formation of the metal at the desired temperature rather than the metal oxide. Reducing agents are particularly applicable when using molecular metal precursor compounds where the ligand is not reducing by itself. Examples of reducing agents include amino alcohols and formic acid. Alternatively, the precursor conversion process can take place under a reducing atmosphere, such as nitrogen, hydrogen or forming gas.

In some cases, the addition of reducing agents results in the formation of the metal even under ambient conditions. The reducing agent can be part of the precursor itself, for example in the case of certain ligands. An example is Cu-formate where the precursor forms copper metal even in ambient air at low temperatures. In addition, the Cu-formate precursor is highly soluble in water, results in a relatively high metallic yield and forms only gaseous byproducts, which are reducing in nature and protect the in-situ formed copper from oxidation. Cu-formate is therefore a preferred molecular metal precursor for aqueous based compositions. Other examples of molecular metal precursors containing a ligand that is a reducing agent are Ni-acetylacetonate and Ni-formate.

The precursor composition can also include an adhesion promoter adapted to improve the adhesion of the conductive feature to the underlying substrate. For example, polyamic acid can improve the adhesion of the precursor composition to a polymer substrate.

The precursor compositions can also include complexing agents. Complexing agents are a molecule or species that binds to a metal atom and isolates the metal atom from solution. Complexing agents are adapted to increase the solubility of the molecular precursors in the solvent, resulting in a higher yield of metal. One preferred complexing agent, particularly for use with Cu-formate and Ni-formate, is 3-amino-1-proponal. For example, a preferred precursor composition for the formation of copper includes Cu-formate dissolved in water and 3-amino-1-propanol.

The precursor compositions according to the present invention can also include a binder to maintain the shape of the deposited feature. The binder can be, for example, a polymer or in some cases can be a precursor. When the precursor composition is deposited onto a flexible substrate, the binder should impart some flexibility to the precursor composition or final product in addition to adherence. In some instances, the binder can melt or soften to permit deposition of the precursor composition. According to one embodiment, the binder is a solid at room temperature and when heated to greater than about 50° C., the binder melts and flows allowing for ease of transfer and good wetting of the substrate. Upon cooling to room temperature, the binder becomes solid again maintaining the shape of the conductive feature.

The binder may need to vaporize during final processing. The binder may also dissolve during printing. The binder is preferably stable at room temperature and does not degrade substantially over time.

Preferred binders for use in the precursor compositions according to the present invention include waxes, styrene allyl alcohols, polyalkylene carbonates, polyvinyl acetals, cellulose based materials, tetradecanol, trimethylolpropane and tetramethylbenzene. The preferred binders have good solubility in a solvent used to formulate the precursor composition and should be processable in the melt form. For example, styrene allyl alcohol is soluble in dimethyleacetimide, solid at room temperature and becomes fluid-like upon heating to 80° C.

In many cases, the binders should decompose cleanly leaving little or no residuals after processing. Decomposition of the binder can occur by vaporization, sublimation or combustion.

The present invention also provides compositions and methods to increase adhesion of the conductive trace to the substrate. Various substrates have different surface characteristics that result in varying degrees of adhesion. The surface can be modified by hydroxylating or functionalizing the surface to provide reaction sites from the precursor compositions. In one embodiment, the surface of a polyfluorinated material is modified by a sodium naphthalenide solution that provides reactive sites for bonding during reaction with the precursor. In another embodiment, a thin layer of metal is sputtered onto the surface to provide for better adhesion of precursor or converted precursor to the substrate. In another embodiment, polyamic acid and the like precursors are added to the precursor composition that then bond with both the conductor and surface to provide adhesion. Preferred amounts of polyamic acid and related compounds are from about 5 to 10 weight percent of the high viscosity precursor compositions.

The precursor compositions of the present invention typically also include surfactants and/or dispersants. Dispersants are added to improve particle dispersion in the vehicle or solvent and reduce inter-particulate attraction within that dispersion. Dispersants are typically two-component structures, namely a polymeric chain and an anchoring group. The anchoring group will lock itself to the particle surface while the polymeric chain prevents agglomeration. It is the particular combination of these, which leads to their effectiveness. The molecular weight of the dispersant is sufficient to provide polymer chains of optimum length to overcome Van der Waals forces of attraction between particles. If the chains are too short, then they will not provide a sufficiently thick barrier to prevent flocculation, which in turn leads to an increase in viscosity. There is generally an optimum chain length over and above which the effectiveness of the stabilizing material ceases to increase. Ideally, the chains should be free to move in the dispersing medium. To achieve this, chains with anchor groups at only one end have been the most effective in providing steric stabilization. An example of a dispersant is SOLSPERSE 21000 (Avecia Limited). For the precursor compositions of the present invention, surfactants should be selected to be compatible with the other components of the composition, particularly the molecular metal precursors. In one embodiment of the present invention, surfactants can serve multiple functions such as a dispersant and a molecular metal precursor to a conductive phase. Another example of a surfactant that is used with Ag flakes is a coupling agent such as Kenrich Titanate, for example as is disclosed in U.S. Pat. No. 4,122,062 by Monte et al., which is incorporated herein by reference in its entirety.

The precursor compositions of the present invention can in addition include rheology modifiers such as additives that have a thickening effect on the liquid vehicle. The advantageous effects of these additives include improved particle dispersion, reduced settling of particles, and reduction or elimination of filter pressing during syringe dispensing or screen-printing. Rheology modifiers can include SOLTHIX 250 (Avecia Limited), styrene allyl alcohol, ethyl cellulose, carboxy methylcellulose, nitrocellulose, polyalkylene carbonates, ethyl nitrocellulose, and the like.

One difficulty that can arise with respect to the precursor compositions of the present invention is that during drying, molecular metal precursors present in the liquid can crystallize and form large crystallites, which can be detrimental to conductivity upon conversion to the conductor. This problem can be reduced or eliminated by adding small amounts of a crystallization-inhibiting agent to the precursor composition. It has been found, for example, that in some silver precursor compositions small additions of lactic acid completely prevent crystallization. In other cases, such as aqueous Cu-formate compositions, small amounts of glycerol can inhibit crystallization. Other compounds useful for inhibiting crystallization are other polyalcohols such as malto dextrin, sodium carboxymethylcellulose and polyoxyethylenephenylether such as TRITON (Mallinckadt Baker, Phillipsburg, N.J.) or IGEPAL (Rhone-Poulenc, Cranbury, N.J.). In general, solvents with a higher melting point and lower vapor pressure inhibit crystallization of a compound more than a lower melting point solvent with a higher vapor pressure. Preferably, not greater than about 10 wt. % crystallization inhibitor (as a percentage of the total solution) is added to a precursor formulation, more preferably not greater than 5 wt. % and even more preferably not greater than 2 wt. %.

For example, preferred silver precursor formulations/solvent systems include Ag-nitrate and DMAc; Ag-nitrate, Ag-acetate, lactic acid and $H_2O$; Ag-acetate and ethanolamine; Ag-trifluoroacetate and DMAc; Ag-trifluoroacetate, polyamic acid and DMAc; Ag-acetate, lactic acid and $H_2O$; Ag-pentafluoropropionate, DMAc and polyamic acid prepolymer; Ag-trifluoroacetate and NMP; Ag powder, trifluoroacetic acid and DMAc; Ag-neodecanoate and DMAc; Ag-neodecanoate, DMAc and diethyleneglycol butylether (DEGBE).

The precursor compositions above can also include other components such as humectants and surface tension modifiers.

According to certain embodiments of the present invention, the precursor composition can be carefully selected to reduce the conversion temperature required to convert the molecular metal precursor compound to the conductive metal. The molecular metal precursor converts at a low temperature by itself or in combination with other molecular metal precursors and provides for a high metal yield. As used herein, the conversion temperature is the temperature at which the metal species contained in the molecular metal precursor compound, is at least 95 percent converted to the pure metal. As used herein, the conversion temperature is measured using a thermogravimetric analysis (TGA) technique wherein a 50-milligram sample of the precursor composition is heated at a rate of 10° C./minute in air and the weight loss is measured.

A preferred approach for reducing the conversion temperature according to the present invention is to bring the molecular metal precursor compound into contact with a conversion reaction inducing agent As used herein, a conversion reaction inducing agent is a chemical compound that effectively reduces the temperature at which the molecular metal precursor compound decomposes to the metal. The conversion reaction inducing agent can either be added into the original precursor composition or added in a separate step during conversion on the substrate. The former method is preferred. Preferably, the conversion temperature of the metal precursors can be preferably lowered by at least about 25° C., more preferably by at least about 50° C. even more preferably by at least about 100° C., as compared to the dry metal precursor compound.

The reaction inducing agent can be the solvent or vehicle that is used for the precursor composition. For example, the addition of certain alcohols can reduce the conversion temperature of the precursor composition.

Preferred alcohols for use as conversion reaction inducing agents according to certain embodiments of the present invention include terpineol and diethyleneglycol butylether (DEGBE). It will be appreciate that the alcohol can also be the vehicle, such as in the case of terpineol.

More generally, organic alcohols such as primary and secondary alcohols that can be oxidized to aldehydes or ketones, respectively, can advantageously be used as the conversion reaction inducing agent. Examples are 1-butanol, diethyleneglycol, DEGBE, octanol, and the like. The choice of the alcohol is determined by its inducing capability as well as its boiling point, viscosity and precursor solubilizing capability. It has unexpectedly been discovered that some tertiary alcohols can also lower the conversion temperature of some molecular metal precursors. For example, alpha-terpineol, which also serves as a vehicle, significantly lowers the conversion temperature of some molecular metal precursors. The boiling point of the conversion reaction inducing agents is preferably high enough to provide for the preferred ratio of metal ions to inducing agent during conversion to metal. It should also be low enough for the inducing agent to escape the deposit cleanly without unwanted side reactions such as decomposition that could lead to carbon residues in the final film. The preferred ratio of metal precursor to inducing agent is stoichiometric for complete reduction. However, in some cases catalytic amounts of the inducing agent are sufficient.

Some solvents, such as DMAc, can serve as both a vehicle and a conversion reaction inducing agent. It can also be regarded as a complexing agent for silver. This means that precursors such as Ag-nitrate that are otherwise not very soluble in organic solvents can be brought into solution by complexing the metal ion with a complexing agent such as DMAc. In this specific case, Ag-nitrate can form a 1:1 adduct with DMAc which is soluble in organic solvents such as N-methylpyrrolidinone (NMP) or DMAc.

Another aspect of lowering the conversion temperature is the ratio of molecular metal precursor to conversion reaction inducing agent. It has been found that the addition of various amounts of DEGBE to a molecular silver precursor such as Ag-trifluoroacetate in DMAc reduces the precursor conversion temperature by up to about 70° C. Most preferred is the addition of stoichiometric amounts of the inducing agent such as DEGBE. Excess amounts of the conversion reaction inducing agent are not preferred because it does not lower the temperature any further. In addition, higher amounts of solvent or inducing agents lower the overall concentration of precursor in solution and can negate other composition characteristics. The ratio of inducing agent to metal ion that is reduced to metal during conversion can be expressed as molar ratio of functional group (inducing part in the reducing agent) to metal ion. The ratio is preferably 1 for univalent metal ions such as Ag, such as in the range from about 1.5 to about 0.5 and more preferably in the range of about 1.25 to about 0.75. For divalent metal ions the ratio is preferably about 2, such as in the range from about 3 to about 1, and for trivalent metals the ratio is preferably about 3, such as in the range from about 4.5 to 1.5.

The molecular precursor preferably provides as high a yield of metal as possible. A preferred ratio of molecular precursor to solvent is that corresponding to greater than 10% mass fraction of metal relative to the total weight of the liquid (i.e., all precursor components excluding particles). As an example, at least 10 grams of conductor is preferably contained in 100 grams of the precursor composition. More preferably, greater than 20 wt. % of the precursor composition is metal, even more preferably greater than 30 wt. %, even more preferably greater than 40 wt. % and most preferably greater than 50 wt. %.

Another approach for reducing the conversion temperature of certain molecular precursors is utilizing a palladium compound as a conversion reaction inducing agent. According to this embodiment, a palladium molecular precursor is added to the precursor composition, which includes another precursor such as a silver precursor. With addition of various Pd compounds, the conversion temperature of the silver precursor can be advantageously reduced by at least 25° C. and more preferably by at least 50° C. Preferred palladium precursors according to this embodiment of the present invention include Pd-acetate, Pd-trifluoroacetate, Pd-neodecanoate and tetraammine palladium hydroxide.

Pd-acetate and Pd-trifluoroacetate are particularly preferred as conversion reaction inducing agent to reduce the conversion temperature of a silver metal carboxylate compound. Small additions of Pd-acetate to a precursor composition that includes Ag-trifluoroacetate in DMAc can reduce the conversion temperature by up to 80° C. Preferred precursor compositions include Pd-acetate in an amount of at least about 1 weight percent, more preferably at least about 2 weight percent of the precursor composition. The upper range for this Pd conversion reaction inducing agent is limited by its solubility in the solvent and in one embodiment does not exceed about 10 weight percent. Most preferred is the use of Pd-trifluoroacetate because of its high solubility in organic solvents. For example, a preferred precursor composition for a silver/palladium alloy according to the present invention is Ag-trifluoroacetate and Pd-trifluoracetate dissolved in DMAc and lactic acid.

A complete range of Ag/Pd alloys can be formed from Ag-trifluoroacetate/Pd-trifluoroacetate combinations in a solvent such as DMAc. The molecular mixing of the metal precursors provides preferred conditions for the formation of virtually any Ag/Pd alloy at low temperature. The conversion temperature of the silver precursor when dissolved in DMAc is preferably reduced by at least 80° C. when combined with Pd-trifluoroacetate. Pure Pd-trifluoroacetate dissolved in DMAc can be converted to pure Pd at the same temperature. As is discussed above, similar conversion temperatures for the Ag and Pd precursor are advantageous since it provides the conditions for good molecular mixing and the formation of Ag/Pd alloys with a homogeneous distribution of Ag and Pd.

DMAc can advantageously serve as both a vehicle and a conversion reaction inducing agent. It can also be regarded as a complexing agent for silver. That is, precursors such as Ag-nitrate that are otherwise not very soluble in organic solvents can be brought into solution by complexing the metal ion with a complexing agent such as DMAc. In this specific case, Ag-nitrate can form a 1:1 adduct with DMAc which is soluble in organic solvents such as NMP or DMAc Other conversion reaction inducing agents that can also lower the conversion temperature for nickel and copper metal precursors can be used such as amines (ammonia, ethylamine, propylamine), amides (DMAc, dimethylformamide, methylformamide, imidazole, pyridine), aminoalcohols (ethanol amine, diethanolamine and triethanolamine), aldehydes (formaldehyde, benzaldehyde, acetaldehyde); formic acid; thiols such as ethyl thioalcohol, phosphines such as trimethylphosphine or triethylphosphine and phosphides. Still other conversion reaction inducing agents can be selected from boranes and borohydrides such as borane-dimethylamine or borane-trimethylamine. Preferred conversion reacting inducing agents are alcohols and amides. Advantageously, DMAc can also function as the solvent for the molecular precursor. Compared to precursor compositions that contain other solvents such as water, the precursor conversion temperature can be reduced by as much as 60° C. to 70° C. Also preferred is DEGBE, which can reduce the decomposition temperature of a silver precursor dissolved in a solvent such as water by as much as 125° C.

Yet another preferred approach for reducing the conversion temperature is to catalyze the reactions using particles, particularly nanoparticles. Preferred particles that catalyze the reaction include pure Pd, Ag/Pd alloy particles and other alloys of Pd. Another approach for reducing the conversion temperature is to use gaseous reducing agents such as hydrogen or forming gas.

Yet another preferred approach for reducing the conversion temperature is ester elimination, either solvent assisted or without solvent assist. Solvent assist refers to a process wherein the alkoxide is converted to an oxide by eliminating an ester. In one embodiment, a metal carboxylate and metal alkoxide are mixed into the formulation. At the processing temperature, the two precursors react and eliminate an organic ester to form a metal oxide that decomposes to the corresponding metal at lower temperature than the precursors themselves. This is also useful for Ag and Au. For Au, the metal oxide formation is skipped.

Another preferred approach for reducing the conversion temperature is by photochemical reduction. For example, photochemical reduction of Ag can be achieved by using precursors containing silver bonds that can be broken photochemically. Another method is to induce photochemical reduction of silver on prepared surfaces where the surface catalyzes the photochemical reaction.

The precursor compositions of the present invention can include a molecular metal precursor formulation and vehicle without nanoparticles or micron-size particles. In a preferred embodiment, the precursor composition includes a conversion reaction inducing agent, which can be either or both of a powder or molecular metal precursor or another inorganic or organic agent. In another embodiment, the precursor composition includes additives to reduce the spreading by controlling the wetting angle of the precursor composition on the surface. In another embodiment, the combination of molecular metal precursor and solvent is chosen to provide a high solubility of the molecular precursor in the solvent. The precursor compositions of the present invention typically combine a molecular metal precursor formulation and particles together with other additives. In one embodiment, the precursor composition includes metal particles, a molecular metal precursor and a vehicle. The molecular metal precursor is preferably a metal organic compound.

In another embodiment, the molecular metal precursor includes conductive micron-size particles, nanoparticles and a vehicle.

In another embodiment, the precursor composition includes conductive micron-size particles, nanoparticles and a vehicle. The nanoparticles can be an inorganic precursor to a conductive phase such as $Ag_2O$ nanoparticles.

In another embodiment, the precursor composition includes micron-size particles, a molecular metal precursor, nanoparticles and a vehicle. Preferably the molecular precursor is a metal organic compound.

In another embodiment, the precursor composition includes micron-size particles, a molecular precursor, nanoparticles and a vehicle. Preferably the precursor is a metal organic compound. The nanoparticles can be an inorganic precursor to a conductive phase such as $Ag_2O$ nanoparticles. The precursor composition can also include precursor, vehicle, and nanoparticles. The nanoparticles can be selected from silver, copper and other metals, or can be non-conductive nanoparticles such as silica, copper oxide and aluminum oxide.

The precursor composition can also include a molecular metal precursor, a vehicle, and a polymer or polymer precursor, such as in cases where adhesion to a polymeric substrate is desired. The precursor to a polymer can be poly (amic) acid. The polymer can be an epoxy, polyimide, phenolic resin, thermo set polyester, polyacrylate and the like. The precursor compositions can include a low curing polymer, such as one that cures at not greater than 200° C., more preferably not greater than 150° C.

The precursor compositions can also include carbon, a molecular metal precursor and a vehicle. The precursor compositions can include particulate carbon, such as conductive graphitic carbon. One preferred combination is conductive carbon with molecular metal precursors to silver metal.

The precursor compositions can also include a conductive polymer, molecular metal precursor and a vehicle. The polymer can be conductive for both electrons and protons. As is discussed in detail above, electrically conductive polymers can be selected from polyacetylene, polyaniline, polyphenylene, polypyrrole, polythiophene, polyethylenedioxythiophene and poly (paraphenylene vinylene). Protonic conductive polymers include those with sulfonates or phosphates, for example sulfonated polyaniline.

The precursor composition can also include conductive nanoparticles and vehicle. The flowable composition can include conductive nanoparticles, a vehicle and polymer precursor.

In precursor compositions that include a molecular metal precursor and powders (nanoparticles and/or micron-size particles), the ratio of molecular metal precursors to powders is ideally close to that corresponding to the amount needed to fill the spaces between particulates with material derived from the molecular metal precursors. However, a significant improvement in conductivity can also be obtained for lower levels of molecular metal precursor. It is preferred that at least about 5 vol. %, more preferably at least about 10 vol. % and even more preferably at least about 15 vol. % of the final conductor be derived from molecular metal precursor.

Other specific precursor compositions according to the present invention are preferred for different applications. Typically, the precursor formulation will take into account the deposition mechanism, the desired performance of the features and the relative cost of the features. For example, simple circuitry on a polymer or other organic substrate designed for a disposable, high-volume application will require a low cost precursor composition but will not require electronic features having superior properties. On the other hand, higher end applications such as for repair of electronic circuitry will require electronic features having very good electrical properties and the relative cost of the precursor composition will typically not be a significant factor.

A precursor composition according to the present invention will typically contain a solid phase made up of particulates. Such particulates can include a molecular precursor to a conductive phase such as silver oxide, silver nitrate, Ag trifluoroacetate crystalites, conductive micron-size particles and nanoparticles of the conductive phase. The liquid phase can include a vehicle and a molecular metal precursor formulation. For precursor compositions, the particulate fraction typically lies between 0 and 55 volume percent of the total precursor composition volume. The precursor fraction of the precursor composition, both present in the form of precursor particles and molecular metal precursor dissolved in the solvents and/or dissolved in the vehicle, is typically expressed as a weight percent of the total precursor comosition weight and can be anywhere between 0 and 80 weight percent of the total precursor composition weight. In precursor compositions that have a significant loading of conductive particles, the precursor fraction is typically between 0 and 40 weight percent.

In one embodiment, the precursor composition includes up to about 40 volume percent carbon and from about 5 to about 15 weight percent of a molecular precursor, with the balance being vehicle and other additives. In another embodiment, the precursor composition includes up to about 30 volume percent carbon and up to about 10 volume percent metal nanoparticles, with the balance being vehicle and other additives.

According to another embodiment, the precursor composition includes up to about 40 volume percent metal nanoparticles and from about 5 to about 15 weight percent of a molecular metal precursor, wherein the balance is vehicle and other additives.

According to another embodiment, the precursor composition includes up to about 50 volume percent micron-size metal particles and from about 5 to about 15 weight percent of a molecular metal precursor with the balance being vehicle and other additives.

According to yet another embodiment, the precursor composition includes up to about 50 volume percent micron-size metal particles, with the balance being a vehicle containing a precursor to a conductive polymer.

In one embodiment of a transparent conductor precursor formulation, the precursor composition contains between 20 and about 40 vol % micron size particles selected from the group of ITO, ATO, ZnO and $SnO_2$, and between 5 and 20 vol. % Ag nanoparticles, and between 0 and 15 weight percent molecular precursor to Ag with the balance being solvents, vehicle and other additives.

In another embodiment of a transparent conductor precursor formulation, the precursor composition contains between 20 and about 50 vol. % micron-size particles selected from the group of ITO, ATO, ZnO, $SnO_2$, and between 5 and 20 weight percent molecular precursor to Ag, with the balance being solvents, vehicle and other additives.

In yet another embodiment of a transparent conductor precursor composition formulation the composition contains between 20 and about 40 vol. % micron-size particles selected from the group of ITO, ATO, ZnO, $SnO_2$, and up to 15 vol % conductive glass particles such as silver phosphate glass, and between 0 and 20 weight percent molecular precursor to Ag with the balance being solvents, vehicle and other additives.

In addition to the foregoing, the precursor compositions according to the present invention can also include carbon particles, such as graphitic particles. Depending upon the other components in the precursor composition, carbon particle loading up to about 50 volume percent can be obtained in the compositions. The average particle size of the carbon particles is preferably not greater than about 1 $\mu$m and the carbon particles can advantageously have a bimodal or trimodal particle size distribution. Graphitic carbon has a bulk resistivity of about 1375 $\mu\Omega$-cm and is particularly useful in conductor precursor compositions that require a relatively low cost.

One embodiment of the present invention is a low cost conductor composition that includes between 20 and 50 vol. % micron-size particles selected from the group of amorphous carbon, carbon graphite, iron, nickel, tungsten, molybdenum, and between 0 and 15 vol. % nanoparticles selected from the group of Ag, carbon, intrinsically conductive polymer, Fe, Cu, Mo, W, and between 0 and 20 weight percent molecular precursor to a metal such as Ag, with the balance being solvents, vehicle and other additives.

In another embodiment of a low cost conductor precursor composition, the precursor composition includes between 20 and 50 vol. % micron-size particles selected from the group of amorphous carbon, graphite, iron, nickel, tungsten, molybdenum, and between 20 and 50 weight percent precursor to a intrinsically conductive polymer, with the balance being solvents, vehicle and other additives.

During conversion of the precursor compositions to the conductive feature, the surface that the composition is printed onto significantly influences how the overall conversion to a final structure occurs. The precursor compositions of the present invention have a low decomposition temperature enabling the compositions to be deposited and heated on a low-temperature substrate to form a conductive trace. The types of substrates that are particularly useful according to the present invention include polyfluorinated compounds, polyimides, epoxies (including glass-filled epoxy), polycarbonates and many other polymers. Particularly useful substrates include cellulose-based materials such as wood or paper, acetate, polyester, polyethylene, polypropylene, polyvinyl chloride, acrylonitrile-butadiene-styrene (ABS), flexible fiber board, non-woven polymeric fabric, woven fabric, cloth, metallic foil, thin glass. Although the present invention can be used for such low-temperature substrates, it will be appreciated that traditional substrates such as anodized metal, glass substrates, and ceramic substrates can also be used in accordance with the present invention.

The substrate can be coated, for example a dielectric on a metallic foil. Further, according to the present invention, the substrate surface can be modified by hydroxylating or otherwise functionalizing the surface, providing reaction sites for the molecular precursor in the precursor composition. For example, the surface of a polyfluorinated material can be modified with a sodium naphthalenide solution that provides reactive sites for bonding during reaction with the molecular precursor. In another embodiment, a thin layer of metal is sputtered onto the surface to provide for better adhesion of the conductive feature to the substrate. In another embodiment, polyamic acid or similar compounds can be added to the precursor composition to bond with both the conductive feature and surface to provide adhesion. Preferred amounts of polyamic acid and similar compounds are 2 percent by weight to 8 percent by weight of the precursor composition.

Another method to improve adhesion is by infiltrating a liquid precursor composition after deposition and thermal treatment of the conductive feature. The liquid precursor composition is a molecular precursor to a metal that can be the same metal as the conductive feature or a different metal. The liquid precursor infiltrates the porous matrix of the conductive feature deposited in the previous step and accumulates at the substrate interface. Heating will convert the liquid precursor to metal and will improve adhesion of the conductive feature to the surface.

In cases where spreading or slumping of the precursor composition is an issue, spreading can be controlled by rapidly drying the precursor compositions during printing by irradiating the deposited composition during deposition.

Precursor composition spreading can also be controlled by the addition of a low decomposition temperature polymer in the form of a monomer. The monomer can be cured during deposition by thermal or ultraviolet means, providing a network structure to help maintain line shape. The polymer can then be either retained or removed during subsequent processing of the conductor.

Another method that is useful in controlling bleeding of the precursor composition out of the deposited features is to pattern the otherwise non-wetting substrate with wetting enhancement agents, which control spreading and increase adhesion. For example, this can be achieved by functionalizing the substrate with hydroxide or carboxylate groups.

The precursor compositions of the present invention can be deposited onto a substrate using a variety of tools and converted into conductive features for electronic applications.

The precursor compositions can be deposited by a direct-write process. For example, the precursor compositions can be ejected through an orifice toward the surface without the tool being in direct contact with the surface. The tool can advantageously be controllable over an x-y grid or even an x-y-z grid such as when depositing the feature onto a non-planar surface. One preferred embodiment of the present invention is directed to the use of automated syringes, such as the MICROPEN tool, available from Ohmcraft, Inc., of Honeoye Falls, N.Y.

Other modes of direct write deposition of the flowable compositions include techniques such as screen-printing, tape casting, intaglio and roll printer. Other printing methods comprise lithographic, gravure and other intaglio printing methods.

Another preferred method for depositing of the precursor composition is screen-printing. In the screen-printing process, a porous screen fabricated from stainless steel, polyester, nylon or similar inert material is stretched and attached to a rigid frame. A predetermined pattern is formed on the screen corresponding to the pattern to be printed. For example, a UV sensitive emulsion can be applied to the screen and exposed through a positive or negative image of the design pattern. The screen is then developed to remove portions of the emulsion in the pattern regions.

The screen is then affixed to a printing device and the precursor composition is deposited on top of the screen. The substrate to be printed is then positioned beneath the screen, the precursor composition is forced through the screen and onto the substrate by a squeegee that traverses the screen. Thus, a pattern of traces and/or pads of the precursor composition material is transferred to the substrate. The substrate with the precursor composition applied in a predetermined pattern is then subjected to a drying and heating treatment to adhere the functional phase to the substrate. For increased line definition, the applied precursor composition can be further treated, such as through a photolithographic process, to develop and remove unwanted material from the substrate.

Some applications of such precursor compositions require higher tolerances than can be achieved using standard thick-film technology, as is described above. As a result, some precursor compositions have photo-imaging capability to enable the formation of lines and features with decreased width and pitch. In this type of process, a photoactive precursor composition is applied to a substrate substantially as is described above. The precursor can include, for example, a liquid vehicle such as polyvinyl alcohol that is not cross-linked. The precursor composition is then dried and exposed to ultraviolet light through a photomask to polymerize the exposed portions of precursor composition and the precursor composition is developed to remove unwanted portions of the composition. This technology permits higher density lines to be formed.

An optional first step, prior to deposition of the precursor composition, is surface modification of the substrate as is described above. The surface modification can be applied to the entire substrate or can be applied in the form of a pattern, such as by using photolithography. The surface modification can include increasing or decreasing the hydrophilicity of the substrate surface by chemical treatment. For example, a silanating agent can be used on the surface of a glass substrate to increase the adhesion and/or to control spreading of the precursor composition through modification of the surface tension and/or wetting angle. The surface modification can also include the use of a laser to clean the substrate. The surface can also be subjected to mechanical modification by contacting with another type of surface. The substrate can also be modified by corona treatment.

For the deposition of organic-based precursor compositions, the activation energy of the substrate surface can be modified.

For example, a line of polyimide can be printed prior to deposition of a precursor composition, such as a silver metal precursor composition, to prevent infiltration of the precursor composition into a porous substrate, such as paper. In another example, a primer material may be printed onto a substrate to locally etch or chemically modify the substrate, thereby inhibiting the spreading of the precursor composition being deposited in the following deposition step. In yet another example, a via can be etched by printing a dot of a chemical that is known to etch the substrate. The via can then be filled in a subsequent printing process to connect circuits being printed on the front and back of the substrate.

As is discussed above, the deposition of the precursor composition can be carried out by syringe-dispense, screen printing, filling of a preformed patterned surface as described in U.S. Pat. No. 4,508,753 or roller printing. In one embodiment, a first deposition step provides the precursor composition including a molecular metal precursor compound while a second deposition step provides a reducing agent or other co-reactant that converts the precursor and/or reduces the conversion temperature. Another method for depositing the precursor composition is using multi-pass deposition to build the thickness of the deposit.

The properties of the deposited precursor composition can also be subsequently modified. This can include freezing, melting and otherwise modifying the composition properties such as viscosity, with or without chemical reactions or removal of material from the precursor composition. For example, a high viscosity precursor composition including a thermoset polymer can be deposited and immediately exposed to a light source such as an ultraviolet lamp to polymerize and thicken the composition and reduce spreading. Depending on the nature of the thermoset polymer, other modification means can be used such as heat lamps or lasers.

After deposition, the precursor composition is treated to convert the precursor composition to the conductive feature. The treatment can include multiple steps, or can occur in a single step, such as when the precursor composition is rapidly heated and held at the conversion temperature for a sufficient amount of time to form the conductive feature.

An optional, initial step can include drying or subliming the composition by heating or irradiating. In this step, material is removed from the composition and/or chemical reactions occur in the composition. An example of a method for processing the deposited composition in this manner is using a UV, IR, laser or a conventional light source.

Heating rates for drying the precursor composition are preferably greater than about 10° C./min, more preferably greater than 100° C./min and even more preferably greater than 1000° C./min. The temperature of the deposited precursor composition can be raised using hot gas or by contact with a heated substrate. This temperature increase may result in further evaporation of solvents and other species. A laser, such as an IR laser, can also be used for heating. IR lamps or a belt furnace can also be utilized. It may also be desirable to control the cooling rate of the deposited feature. The heating step can also coincide with the activation of a conversion reaction inducing agent present in the precursor composition. The action of such conversion reaction inducing agent could include removal of the surface oxide on particles such as Cu particles or Ni particles.

After drying, the next step is to react the molecular metal precursors. In one embodiment, the precursor composition is reacted using various gases to assist in the conversion of the precursor composition to a conductive feature. For example, hydrogen, nitrogen, and reducing gases can be used to assist the reaction. Copper, nickel, and other metals that oxidize when exposed to oxygen may require the presence of reducing atmospheres. It has been found that the precursor compositions of the present invention can advantageously provide very short reaction times when processed with light (e.g., a laser) that heats the materials. This is a result of the high chemical reaction rates when sufficiently high temperatures are provided for a specific precursor and the ability of light to rapidly heat the materials over time scales of milliseconds or even less. In the case of precursor compositions including particles, phases having a low melting or softening point allow short processing times.

The precursor compositions of the present invention can be processed for very short times and still provide useful materials. Short heating times can advantageously prevent damage to the underlying substrate. Preferred thermal processing times for deposits having a thickness on the order of about 10 $\mu$m are not greater than about 100 milliseconds, more preferably not greater than about 10 milliseconds, and even more preferably not greater than about 1 millisecond. The short heating times can be provided using laser (pulsed or continuous wave), lamps, or other radiation. Particularly preferred are scanning lasers with controlled dwell times. When processing with belt and box furnaces or lamps, the hold time is preferably not greater than 60 seconds, more preferably not greater than 30 seconds, and even more preferably not greater than 10 seconds. The heating time can even be not greater than 1 second when processed with these heat sources, and even not greater than 0.1 second, while providing conductive materials that are useful in a variety of applications. It will be appreciated that short heating times may not be beneficial if the solvent or other constituents boil rapidly and form porosity or other defects in the feature.

Typically, the deposited precursor compositions can be substantially fully converted at temperatures of not greater than 300° C., preferably not greater than 250° C., more preferably not greater than 225° C., even more preferably not greater than 200° C., and even more preferably not greater than 185° C.

The particles in the precursor composition (if any) or the material derived from the precursor can optionally be sintered subsequent to decomposition of the metal precursor. The sintering can be carried out using furnaces, light sources such as heat lamps and/or lasers. In one embodiment, the use of a laser advantageously provides very short sintering times and in one embodiment the sintering time is not greater than 1 second, more preferably not greater than 0.1 seconds and even more preferably not greater than 0.01 seconds. Laser types include pulsed and continuous wave. In one embodiment, the laser pulse length is tailored to provide a depth of heating that is equal to the thickness of the material to be sintered. The components in the precursor composition can be fully or partially reacted before contact with laser light. The components can be reacted by exposure to the laser light and then sintered. In addition, other components in the precursor composition (e.g., glasses) can melt and flow under these conditions.

The conductive feature can be post-treated after deposition and conversion of the metal precursor. For example, the crystallinity of the phases can be increased by laser processing. The post-treatment can also include cleaning and/or encapsulation of the electronic features, or other modifications.

It will be appreciated from the foregoing discussion that two or more of the latter process steps (drying, heating, reacting and sintering) can be combined into a single process step.

The foregoing process steps can be combined in several preferred combinations.

For example, one preferred process flow includes the steps of forming a structure by screen printing, photopatterning, thin film or wet subtractive methods; identifying locations requiring the addition of material; adding material by direct-write deposition of a precursor composition; and processing to form the final product. In a specific embodiment, a circuit is prepared by screen-printing and then repaired by syringe-dispense printing.

In another embodiment, features larger than approximately 100 μm are first deposited by screen-printing. Features having a size of not greater than 100 μm are then deposited by a direct deposition method using syringe dispense of a precursor composition.

In yet another embodiment, a precursor composition is deposited, dried, reacted at not greater than about 300° C., more preferably at not greater than about 250° C., and is then laser sintered.

In yet another embodiment, a precursor composition is deposited, dried, and reacted with a total reaction time of not greater than about 100 seconds, more preferably not greater than about 10 seconds and even more preferably not greater than about 1 second.

In yet another embodiment, a precursor composition is deposited, dried, and reacted, wherein the total time for the deposition, drying and reaction is preferably not greater than about 60 seconds, more preferably not greater than about 10 seconds and even more preferably not greater than about 1 second.

In yet another embodiment, a polyimide surface is first modified to promote adhesion of the high viscosity precursor composition. Precursor composition is deposited, and then the composition is dried and converted at a temperature of not greater than 300° C., more preferably at not greater than about 250° C.

Preferably, the conductive feature has a resistivity that is not greater than 10 times the bulk resistivity of the metal, preferably not greater than 6 times the bulk resistivity, more preferably not greater than 4 times the bulk resistivity and most preferably not greater than 2 times the bulk resistivity of the metal.

The products derived from the precursor compositions of the present invention can include a variety of material combinations.

In one embodiment, a conductive feature comprises silver and copper. In a preferred embodiment, the feature includes discrete regions of copper metal that are derived from particles, preferably particles having an average size of not greater than 1 μm. According to this embodiment, the copper metal is dispersed in a matrix of silver that is derived from a molecular metal precursor. The silver and copper are not substantially interdiffused as when derived from high fire precursor compositions. In one embodiment, the feature includes about 85 vol. % copper and 15 vol. % silver. In another embodiment, the silver derived from the precursor also includes an amount of copper, palladium or some other metal that provides resistance to electromigration or powder solderability.

In another embodiment, the conductive feature includes silver and palladium. In another preferred embodiment, the feature includes regions of substantially pure silver dispersed in a matrix of silver-palladium that provides resistance to solder leaching. In a particularly preferred embodiment, the silver-palladium is derived from precursors and the overall feature includes not greater than about 2 vol. % palladium, such as not greater than 1 vol. % palladium. In another embodiment, the palladium is replaced with another metal derived from a precursor to provide a silver matrix that includes an amount of copper or some other metal that provides resistance to electromigration or solder leaching.

In yet another embodiment, the conductive feature includes silver or copper derived from a precursor and an insulating phase. The insulating phase is preferably a glass or metal oxide. Preferred glasses are aluminum borosilicates, lead borosilicates and the like. Preferred metal oxides are silica, titania, alumina, and other simple and complex metal oxides. The insulating phase is derived from particles in the precursor composition.

The conductor composition can also be a composite of dissimilar materials. The composite can include metal-metal oxide, metal-polymer, metal-glass, carbon-metal, and other combinations. The conductor composition can also include solder-like compositions. For example, the composition can include silver, lead, tin, indium, copper, and other similar metallic elements.

In accordance with the foregoing, the present invention enables the formation of features for devices and components having a small average feature size. In particular, features having a small feature size can be formed by syringe-dispense of the precursor compositions. For example, the method of the present invention can be used to fabricate features having an average width (width being the smallest feature dimension in the x-y direction) of not greater than about 100 μm, preferably not greater than about 75 μm, more preferably not greater than 50 μm and even more preferably not greater than 25 μm. These feature sizes can be provided using fine orifice syringe dispensing and other printing approaches that provide droplets or discrete units of the precursor composition to a surface. In one embodiment, the small features are obtained by using a precursors composition comprising spherical metal particles. The small feature sizes can advantageously be applied to various components and devices.

The conductors formed by the present invention have combinations of various features that have not been attained using other high viscosity precursor compositions. After heating the formulations of the present invention will yield solids, which may or may not be porous, with specific bulk resistivity values. The bulk resistivity values of a number of fully dense solids are provided in the Table 6.

TABLE 6

Bulk Resistivity of Various Materials

| Material | Bulk Resistivity (micro-Ω cm) |
|---|---|
| silver (Ag-thick film material fired at 850° C.) | 1.59 |
| copper (Cu) | 1.68 |
| gold (Au) | 2.24 |
| aluminum (Al) | 2.65 |
| Ferro CN33-246 (Ag + low melting glass, fired at 450° C. | 2.7–3.2 |
| SMP Ag flake + precursor formulation, 250° C. | 4.5 |
| molybdenum (Mo) | 5.2 |
| Tungsten (W) | 5.65 |

TABLE 6-continued

Bulk Resistivity of Various Materials

| Material | Bulk Resistivity (micro-Ω cm) |
| --- | --- |
| zinc (Zn) | 5.92 |
| nickel (Ni) | 6.84 |
| iron (Fe) | 9.71 |
| palladim (Pd) | 10.54 |
| platinum (Pt) | 10.6 |
| tin (Sn) | 11 |
| Solder (Pb—Sn; 50:50) | 15 |
| Lead | 20.64 |
| titanium nitrate (TiN transparent conductor) | 20 |
| polymer thick film (state of the art Ag filled polymer, 150° C.) | 18–50 |
| polymer thick film (Cu filled polymer) | 75–300 |
| ITO indium tin oxide ($IN_2O_3$) | 100 |
| zinc oxide (ZnO) doped–undoped) | 120–450 |
| Carbon (C-grphite) | 1375 |
| Doped silver phosphate glass, 330° C. | 3000 |
| ruthenium oxide ($RuO_2$) type conductive oxides | 5000–10,000 |
| intrinsically conductive polymer | 1,000,000 |

The present invention is particularly useful for fabrication of conductors with resistivities that are not greater than 20 times the resistivity of the substantially pure bulk conductor, more preferably not greater than 10 times the substantially pure bulk conductor, even more preferably not greater than 6 times and most preferably not greater than 2 times that of the substantially pure bulk conductor. High conductivity can be provided through precursor compositions including molecular precursors to silver, copper, platinum, palladium, gold, nickel or copper.

According to the present invention, a precursor composition including up to about 50 volume percent micron-size metal particles and from about 5 to about 15 weight percent of a molecular precursor with the balance being vehicle and other additives, can yield a bulk conductivity in the range from 1 to 5 times the bulk metal conductivity after heating at between 200° C. and 300° C.

According to another embodiment, a precursor composition including up to about 50 volume percent micron-size metal particles, with the balance being a vehicle containing a precursor to a conductive polymer, can yield a bulk conductivity in the range from 5 to 50 times the bulk conductivity of the metal phase after heating at between 100° C. and 200° C.

The layers of the present invention can advantageously combine the attributes of being white in color or semi-transparent for aesthetic purposes while having a sheet resistivity of not greater than 100,000 ohms/square, more preferably not greater than 10,000 ohms/square and even more preferably not greater than 1000 ohms/square. Preferred compositions according to this embodiment include zinc oxide.

According to another embodiment of the present invention, a transparent conductor precursor formulation containing about 40 vol. % micron-size particles selected from the group of ITO, ATO, ZnO, $SnO_2$, and about 15 vol. % Ag nanoparticles, and between 0 and 20 weight percent of a precursor to Ag with the balance being solvents, vehicle and other additives, can yield a bulk conductivity in the range from 200 to 1000 micro-ohm-centimeter after firing at 250° C. to 400° C.

According to another embodiment of the present invention, a transparent conductor precursor formulation containing up to about 50 vol. % micron-size particles selected from the group of ITO, ATO, ZnO, $SnO_2$, and between 5 and 15 weight percent of a precursor to Ag, with the balance being solvents, vehicle and other additives can yield a conductivity in the range from 200 to 5000 micro-ohm-centimeter after firing at between 150° C. and 300° C.

According to another embodiment, a transparent conductor precursor formulation containing up to about 45 vol % micron-size particles selected from the group of ITO, ATO, ZnO, $SnO_2$, and up to 20 vol. % conductive glass particles such as silver phosphate glass, and between 0 and 20 weight percent precursor to Ag with the balance being solvents, vehicle and other additives can yield bulk conductivity in the range from 300 to 1000 micro-ohm-centimeter after firing at between 300° C. and 500° C.

According to another embodiment, a low cost conductor precursor composition including 20 to 40 vol. % micron-size particles selected from the group of amorphous carbon, carbon graphite, iron, nickel, tungsten, molybdenum, and between 0 and 15 vol. % nanoparticles selected from the group of Ag, carbon, intrinsically conductive polymer, Fe, Cu, Mo, W, and between 0 and 15 weight percent precursor to a metal such as Ag, with the balance being solvents, vehicle and other additives, will yield a bulk conductivity in the range from 50 to 4000 micro-ohm-centimeter after firing at 250° C. to 400° C.

According to another embodiment, a low cost conductor precursor composition comprising 20 to 40 vol. % micron-size particles selected from the group of amorphous carbon, graphite, iron, nickel, tungsten, molybdenum, and between 10 and 30 weight percent precursor to a intrinsically conductive polymer, with the balance being solvents, vehicle and other additives, can yield a bulk conductivity in the range from 1,000 to 10,000 micro-ohm-centimeter after heating at between 100° C. and 200° C.

The silver-palladium precursor compositions of the present invention can also provide a conductive feature having resistance to solder leaching. In one embodiment, the compositions provide resistance to 3 dips in standard 60/40 lead-tin solder at its melting point.

The precursor compositions and methods of the present invention advantageously allow the fabrication of various unique structures.

In one embodiment, the average thickness of the deposited feature is greater than about 1 μm, more preferably is greater than about 5 μm and even more preferably is greater than about 10 μm.

Vias can also be filled with the high viscosity precursor compositions of the present invention. The via can be filled, dried to remove the volume of the solvent, filled further and two or more cycles of this type can be used to fill the via. The via can then be processed to convert the material to its final composition. After conversion, it is also possible to add more composition, dry and then convert the material to replace the volume of material lost upon conversion to the final product.

The compositions and methods of the present invention produce features that have good adhesion to the substrates on which they are formed. For example, the conductive features will adhere to the substrate with a peel strength of at least 10 newtons/cm (N/cm). Adhesion can be measured using the scotch-tape test, wherein scotch-tape is applied to the feature and is pulled perpendicular to the plane of the trace and the substrate. This applies a force of about 10 N/cm. A passing measure is when little or no residue from the feature remains on the tape.

The precursor compositions and methods of the present invention can advantageously be used in a variety of applications.

For example, the precursor compositions and methods of the present invention can be used to fabricate transparent antennas for RF tags and smart cards. This is enabled by compositions including a conductive metal oxide. In another embodiment, the compositions can include some metal to enhance conductivity. In one embodiment, the antenna includes a conductive feature with resistivity of from about 10 to about 100,000 ohms/square. In another embodiment, the antenna includes a conductor with a resistivity of not greater than about 3 times the resistivity of bulk silver. High conductivity features are required for inductively coupled antennas whereas low cost conductors can be used for electrostatic (capacitively coupled) antennas. The precursor compositions can also serve as solder replacements. The precursor compositions for such applications would include metals such as silver, lead or tin.

The precursor compositions and methods can be utilized to provide connection between chips and other components in smart cards and RF tags.

In one embodiment, the substrate is not planar and a non-contact printing method is used. The non-contact printing method can be syringe-dispense providing deposition of discrete units of composition onto the surface. Examples of surfaces that are non-planar include in windshields, electronic components, electronic packaging and visors.

The precursor compositions and methods provide the ability to print disposable electronics such as for games included in magazines. The precursor compositions can advantageously be deposited and reacted on cellulose-based materials such as paper or cardboard. The cellulose-based material can be coated if necessary to prevent bleeding of the precursor composition into the substrate. For example, the cellulose-based material can be coated with a UV curable polymer.

The precursor compositions and methods can also be used to form under bump metallization, redistribution patterns and basic circuit components.

The precursor compositions and processes of the present invention can also be used to fabricate microelectronic components such as multichip modules, particularly for prototype designs or low-volume production.

Another technology where the direct-write deposition of conductive features according to the present invention provides significant advantages is for flat panel displays, such as plasma display panels and solar cells. High resolution syringe dispensing of low fire conductors is a particularly useful method for forming the electrodes for a plasma display panel and solar cells. The precursor compositions and deposition methods according to the present invention can advantageously be used to form the electrodes, bus lines and barrier ribs, for a plasma display panel. Typically, a metal paste is printed onto a glass substrate and is fired in air at from about 450° C. to 600° C. The precursor compositions of the present invention can be processed at much lower temperatures. Direct-write deposition offers many advantages including faster production time and the flexibility to produce prototypes and low-volume production. The deposited features can have high resolution and dimensional stability and can have a high density.

Another type of flat panel display is a field emission display (FED). The deposition method of the present invention can advantageously be used to deposit the microtip emitters that are used in FEDs. More specifically, a direct-write deposition process such as a syringe-dispense process can be used to accurately and uniformly create the microtip emitters on the backside of the display panel.

The present invention is also applicable to inductor-based devices including transformers, power converters and phase shifters. Examples of such devices are illustrated in: U.S. Pat. No. 5,312,674 by Haertling et al.; U.S. Pat. No. 5,604,673 by Washburn et al.; and U.S. Pat. No. 5,828,271 by Stitzer. Each of the foregoing U.S. Patents is incorporated herein by reference in their entirety. In such devices, the inductor is commonly formed as a spiral coil of an electrically conductive feature, typically using a thick-film paste method. To provide the most advantageous properties, the metallized layer, which is typically silver, must have as fine a pitch (line spacing) as possible. More specifically, the output current can be greatly increased by decreasing the line width and decreasing the distance between lines. The direct-write process of the present invention is particularly advantageous for forming such devices, particularly when used in a low-temperature cofired ceramic package (LTCC).

The precursor compositions of the present invention can also be used to fabricate antennas such as antennas used for cellular telephones. The design of antennas typically involves many trial and error iterations to arrive at the optimum design. The direct-write process of the present invention advantageously permits the formation of antenna prototypes in a rapid and efficient manner, thereby reducing product development time. Examples of microstrip antennas are illustrated in: U.S. Pat. No. 5,121,127 by Toriyama; U.S. Pat. No. 5,444,453 by Lalezari; U.S. Pat. No. 5,767,810 by Hagiwara et al.; and U.S. Pat. No. 5,781,158 by Ko et al. Each of these U.S. patents is incorporated herein by reference in their entirety.

The method of the present invention can also be used to apply underfill materials that are used below electronic chips to attach the chips to surfaces and other components. Hollow particles are particularly advantageous because they are substantially neutrally buoyant. This allows them to be used in underfill applications without settling of the particles in the liquid between the chip and surface below. Further, the spherical morphology of the particles allows them to flow better through the small gap. This significantly reduces the stratification that is often observed with dense particles.

Metal-carbon composite powders can also be used to form conductive features. Such electrically conductive features can advantageously be deposited using direct syringe dispensing of highly flowable precursor compositions into intricate patterns without the necessity of forming individual screens for each pattern.

The precursor compositions of the present invention can be used in a variety of applications. These include the circuitry for a disposable calculator, sensors comprising conductive features of pure metal on an organic, semiconductor, or glass substrates for solar cell technology, disposable cell phones, games in a magazine, electronic paper, replacement for wire bonding in a smart card or RF tag.

The present invention can be used to fabricate electrodes including a conductor with a resistivity of the metal not higher than 10× the bulk conductor resistivity. According to one embodiment of the present invention, the electrode can be in a battery. The electrode can have a grid pattern. According to another embodiment of the present invention, the electrode can be in a sensor. According to another embodiment of the present invention, the electrode can be in a display. According to yet another embodiment of the present invention, the electrode can be part of a solar cell. The electrode can be in the pattern of lines that are parallel. The electrode can be in a super capacitor. The electrode can be in a capacitor. The capacitor electrode can have a lacy structure corresponding to low lay downs of metal. According to another embodiment of the present invention, the electrode can be in a fuel cell. The present invention can be used to make the current collector in a solar cell.

The compositions and methods of the present invention can also produce conductive patterns that can be used in flat panel displays. The conductive materials used for electrodes in display devices have traditionally been manufactured by commercial deposition processes such as etching, evaporation, and sputtering onto a substrate. In electronic displays it is often necessary to utilize a transparent electrode to ensure that the display images can be viewed. Indium tin oxide (ITO), deposited by means of vacuum-deposition or a sputtering process, has found widespread acceptance for this application. U.S. Pat. No. 5,421,926 by Yukinobu et al. discloses a process for printing ITO inks. For rear electrodes (i.e., the electrodes other than those through which the display is viewed) it is often not necessary to utilize transparent conductors. Rear electrodes can therefore be formed from conventional materials and by conventional processes. Again, the rear electrodes have traditionally been formed using costly sputtering or vacuum deposition methods. The compositions according to the present invention allow the deposition of metal electrodes onto low temperature substrates such as plastics. For example, a silver precursor composition can be deposited and heated at 150° C. to form 150 μm by 150 μm square electrodes with excellent adhesion and sheet resistivity values of less than 1 ohms per square.

Nonlinear elements, which facilitate matrix addressing, are an essential part of many display systems. For a display of M×N pixels, it is desirable to use a multiplexed addressing scheme whereby M column electrodes and N row electrodes are patterned orthogonally with respect to each other. Such a scheme requires only M+N address lines (as opposed to M×N lines for a direct-address system requiring a separate address line for each pixel). The use of matrix addressing results in significant savings in terms of power consumption and cost of manufacture. As a practical matter, the feasibility of using matrix addressing usually hinges upon the presence of a nonlinearity in an associated device. The nonlinearity eliminates crosstalk between electrodes and provides a thresholding function. A traditional way of introducing nonlinearity into displays has been to use a backplane having devices that exhibit a nonlinear current/voltage relationship. Examples of such devices include thin-film transistors (TFT) and metal-insulator-metal (MIM) diodes. While these devices achieve the desired result, they involve thin-film processes, which suffer from high production costs as well as relatively poor manufacturing yields.

The present invention allows the deposition of the conductive components of nonlinear devices including the source the drain and the gate. These nonlinear devices may include deposited organic materials such as organic field effect transistors (OFET) or organic thin film transistors (OTFT), inorganic materials and hybrid organic/inorganic devices such as a polymer based field effect transistor with an inorganic gate dielectric. Deposition of these conductive materials will enable low cost manufacturing of large area flat displays.

The compositions and methods of the present invention produce conductive patterns that can be used in flat panel displays to form the address lines or data lines. The lines may be made from transparent conducting polymers, transparent conductors such as ITO, metals or other suitable conductors. The precursor compositions of the present invention allow deposition on large area flexible substrates such as plastic substrates and paper substrates, which are particularly useful for large area flexible displays. Address lines may additionally be insulated with an appropriate insulator such as a non-conducting polymer or other suitable insulator. Alternatively, an appropriate insulator may be formed so that there is electrical isolation between row conducting lines, between row and column address lines, between column address lines or for other purposes. These lines can be deposited with a thickness of about one μm and a line width of 100 μm. These data lines can be formed continuously on large substrates with an uninterrupted length of several meters. The deposited lines can be heated to 200° C. to form metal lines with a bulk conductivity that is not less than 10 percent of the conductivity of the equivalent pure metal.

Flat panel displays may incorporate emissive or reflective pixels. Some examples of emissive pixels include electroluminescent pixels, photoluminescent pixels such as plasma display pixels, field emission display (FED) pixels and organic light emitting device (OLED) pixels. Reflective pixels include contrast media that can be altered using an electric field. Contrast media may be electrochromic material, rotatable microencapsulated microspheres, polymer dispersed liquid crystals (PDLCs), polymer stabilized liquid crystals, surface stabilized liquid crystals, smectic liquid crystals, ferroelectric material, or other contrast media well known in art. Many of these contrast media utilize particle-based non-emissive systems. Examples of particle-based non-emissive systems include encapsulated electrophoretic displays (in which particles migrate within a dielectric fluid under the influence of an electric field); electrically or magnetically driven rotating-ball displays as disclosed in U.S. Pat. Nos. 5,604,027 and 4,419,383, which are incorporated herein by reference in their entirety; and encapsulated displays based on micromagnetic or electrostatic particles as disclosed in U.S. Pat. Nos. 4,211,668, 5,057,363 and 3,683,382, which are incorporated herein by reference in their entirety. A preferred particle non-emissive system is based on discrete, microencapsulated electrophoretic elements, examples of which are disclosed in U.S. Pat. No. 5,930,026 by Jacobson et al. which is incorporated herein by reference in its entirety.

In one embodiment, the present invention relates to depositing conductive features, such as electrical interconnects and electrodes for addressable, reusable, paper-like visual displays. Examples of paper-like visual displays include "gyricon" (or twisting particle) displays and forms of electronic paper such as particulate electrophoretic displays (available from E-ink Corporation, Cambridge, Mass.). A gyricon display is an addressable display made up of optically anisotropic particles, with each particle being selectively rotatable to present a desired face to an observer. For example, a gyricon display can incorporate "balls" where each ball has two distinct hemispheres, one black and the other white. Each hemisphere has a distinct electrical characteristic (e.g., zeta potential with respect to a dielectric fluid) so that the ball is electrically as well as optically anisotropic. The balls are electrically dipolar in the presence of a dielectric fluid and are subject to rotation. A ball can be selectively rotated within its respective fluid-filled cavity by application of an electric field, so as to present either its black or white hemisphere to an observer viewing the surface of the sheet.

In another embodiment, the present invention relates to electrical interconnects and electrodes for organic light emitting displays (OLEDs). Organic light emitting displays are emissive displays consisting of a transparent substrate coated with a transparent conducting material (e.g., ITO), one or more organic layers and a cathode made by evaporating or sputtering a metal of low work function characteristics (e.g., calcium or magnesium). The organic layer materials are chosen so as to provide charge injection and transport from both electrodes into the electroluminescent organic layer (EL), where the charges recombine to emit light. There may be one or more organic hole transport layers (HTL) between the transparent conducting material and the EL, as well as one or more electron injection and transporting layers between the cathode and the EL. The precursor compositions according to the present invention allow the direct deposition of metal electrodes onto low temperature substrates such as flexible large area plastic substrates that are particularly preferred for OLEDs. For example, a metal precursor composition can be ink-jet printed and heated at 150° C. to form a 150 $\mu$m by 150 $\mu$m square electrode with excellent adhesion and a sheet resistivity value of less than 1 ohm per square. The compositions and methods of the present invention also enable deposition of row and column address lines for OLEDs. These lines can be deposited with a thickness of about one $\mu$m and a line width of 100 $\mu$m. The deposited precursor lines can be heated to 150° C. and form metal lines with a bulk conductivity that is no less than 5 percent of the conductivity of the equivalent pure metal.

In one embodiment, the present invention relates to electrical interconnects and electrodes for liquid crystal displays (LCDs), including passive-matrix and active-matrix. Particular examples of LCDs include twisted nematic (TN), supertwisted nematic (STN), double supertwisted nematic (DSTN), retardation film supertwisted nematic (RFSTN), ferroelectric (FLCD), guest-host (GHLCD), polymer-dispersed (PD), polymer network (PN).

Thin film transistors (TFTs) are well known in the art, and are of considerable commercial importance. Amorphous silicon-based thin film transistors are used in active matrix liquid crystal displays. One advantage of thin film transistors is that they are inexpensive to make, both in terms of the materials and the techniques used to make them. In addition to making the individual TFTs as inexpensively as possible, it is also desirable to inexpensively make the integrated circuit devices that utilize TFTs. Accordingly, inexpensive methods for fabricating integrated circuits with TFTs, such as those of the present invention, are an enabling technology for printed logic.

For many applications, inorganic interconnects are not adequately conductive to achieve the desired switching speeds of an integrated circuit due to high RC time constants. Printed pure metals, as enabled by the precursor compositions of the present invention, achieve the required performance. A metal interconnect deposited by using a silver precursor composition as disclosed in the present invention will result in a reduction of the resistance (R) and an associated reduction in the time constant (RC) by a factor of 100,000, more preferably by 1,000,000, as compared to current conductive polymer interconnect material used to connect polymer transistors.

Field-effect transistors (FETs), with organic semiconductors as active materials, are the key switching components in contemplated organic control, memory, or logic circuits, also referred to as plastic-based circuits. An expected advantage of such plastic electronics is the ability to fabricate them more easily than traditional silicon-based devices. Plastic electronics thus provide a cost advantage in cases where it is not necessary to attain the performance level and device density provided by silicon-based devices. For example, organic semiconductors are expected to be much less sensitive to air than recently proposed solution-deposited inorganic semiconductor materials. For these reasons, there have been significant efforts expended in the area of organic semiconductor materials and devices.

Organic thin film transistors (TFTs) are expected to become key components in the plastic circuitry used in display drivers of portable computers and pagers, and memory elements of transaction cards and identification tags. A typical organic TFT circuit contains a source electrode, a drain electrode, a gate electrode, a gate dielectric, an interlayer dielectric, electrical interconnects, a substrate, and semiconductor material. The precursor compositions of the present invention can be used to deposit all the components of this circuit, with the exception of the semiconductor material.

One of the most significant factors in bringing organic TFT circuits into commercial use is the ability to deposit all the components on a substrate quickly, easily and inexpensively as compared with silicon technology (i.e., by reel-to-reel printing). The precursor compositions of the present invention enable the use of low cost deposition techniques for depositing these components.

The precursor compositions of the present invention are particularly useful for the deposition of electrical connectors as well as antennae of smart tags, smart labels, and a wide range of identification devices such as radio frequency identification (RFID) tags. In a broad sense, the conductive precursor compositions can be utilized for electrical connection of semiconductor radio frequency transceiver devices to antenna structures and particularly to radio frequency identification device assemblies. A radio frequency identification device ("RFID") by definition is an automatic identification and data capture system comprising readers and tags. Data is transferred using electric fields or modulated inductive or radiating electromagnetic carriers. RFID devices are becoming more prevalent in such configurations as, for example, smart cards, smart labels, security badges, and livestock tags.

The precursor compositions of the present invention also enable the low cost, high volume, highly customizable production of electronic labels. Such labels can be formed in various sizes and shapes for collecting, processing, displaying and/or transmitting information related to an item in human or machine readable form. The precursor compositions of the present invention can be used to form the conductive features required to form the logic circuits, electronic interconnections, antennae, and display features in electronic labels. The electronic labels can be an integral part of a larger printed item such as a lottery ticket structure with circuit elements disclosed in a pattern as disclosed in U.S. Pat. No. 5,599,046.

In another embodiment of the present invention, the conductive patterns made in accordance with the present invention can be used as electronic circuits for making photovoltaic panels. Currently, conventional screen-printing is used in mass scale production of solar cells. Typically, the top contact pattern of a solar cell consists of a set of parallel narrow finger lines and wide collector lines deposited essentially at a right angle to the finger lines on a semiconductor substrate or wafer. Such front contact formation of crystalline solar cells is performed with standard screen-printing techniques.

Low series resistance and low metal coverage (low front surface shadowing) are basic requirements for the front surface metallization in solar cells. Minimum metallization widths of 100 to 150 $\mu$m are obtained using conventional screen-printing. This causes a relatively high shading of the front solar cell surface. In order to decrease the shading, a large distance between the contact lines, i.e., 2 to 3 mm is required. On the other hand, this implies the use of a highly doped, conductive emitter layer. However, the heavy emitter doping induces a poor response to short wavelength light. Narrower conductive lines can be deposited using the precursor composition and deposition methods of the present invention. The conductive precursor compositions of the present invention enable the deposition of finer features down to 20 μm. The precursor compositions of the present invention further enable the deposition of pure metals with resistivity values of the printed features as low as 2 times bulk resistivity after processing at temperatures as low as 200° C.

The low processing and deposition capabilities according to the present invention are particularly enabling for large area solar cell manufacturing on organic and flexible substrates. This is particularly useful in manufacturing novel solar cell technologies based on organic photovoltaic materials such as organic semiconductors and dye sensitized solar cell technology as disclosed in U.S. Pat. No. 5,463,057 by Graetzel et al. The precursor compositions according to the present invention can be deposited and heated to yield a bulk conductivity that is no less than 10 percent of the conductivity of the equivalent pure metal, and achieved by heating the features at temperatures below 200° C. on polymer substrates such as plexiglass (PMMA).

Another embodiment of the present invention enables the production of an electronic circuit for making printed wiring board (PWBs) and printed circuit boards (PCBs). In conventional subtractive processes used to make printed-wiring boards, wiring patterns are formed by preparing pattern films. The pattern films are prepared by means of a laser plotter in accordance with wiring pattern data outputted from a CAD (computer-aided design system), and are etched on copper foil by using a resist ink or a dry film resist.

In such conventional processes, it is necessary to first form a pattern film, and to prepare a printing plate in the case when a photo-resist ink is used, or to take the steps of lamination, exposure and development in the case when a dry film resist is used.

Such methods can be said to be methods in which the digitized wiring data are returned to an analog image-forming step. Screen-printing has a limited work size because of the printing precision of the printing plate. The dry film process is a photographic process and, although it provides high precision, it requires many steps, resulting in a high cost especially for the manufacture of small lots.

The precursor composition and printing methods of the present invention offer solutions to overcome the limitations of the current PWB formation process. The printing methods of the present invention are a single step direct printing process and are compatible with small-batch and rapid turn around production runs. For example, a copper precursor composition can be deposited onto FR4 (a polymer impregnated fiberglass) to form interconnection circuitry. These features are formed by heating the printed copper precursor in an $N_2$ ambient at 150° C. to form copper lines with a line width of not greater than 100 um, a line thickness of not greater than 5 μm, and a bulk conductivity that is not less than 10 percent of the conductivity of the pure copper metal.

Patterned electrodes obtained by one embodiment of the present invention can also be used for screening electromagnetic radiation or earthing electric charges, in making touch screens, radio frequency identification tags, electrochromic windows and in imaging systems, e.g., silver halide photography or electrophotography. A device such as the electronic book described in U.S. Pat. No. 6,124,851 can be formed using the compositions of the present invention

EXAMPLES

For reference purposes, pure Ag-trifluoroacetate has a normal decomposition temperature of about 325° C. as indicated by thermogravimetric analysis. Pure Ag-acetate decomposes at about 255° C. As used in these examples, thermogravimetric analysis consisted of heating samples (typically 50 milligrams) in air at a heating rate of 10° C./minute and observing the weight loss of the sample.

Example 1 (Comparative Example)

A mixture of 0.1 grams alpha terpineol and 0.9 grams Ag-trifluoroacetate was formed, which corresponds to 6.285 moles of the silver precursor to one mole of terpineol. The mixture was subjected to TGA analysis, which showed that the composition converted to substantially pure silver at about 290° C. This example illustrates that the decomposition temperature is not substantially reduced at a high molar ratio of precursor to inducing agent.

Example 2 (Comparative Example)

A mixture of 0.9 grams alpha terpineol and 0.1 grams Ag-trifluoroacetate was formed, which corresponds to 0.069 moles of precursor to one mole of terpineol. The mixture was subjected to TGA analysis, which showed that the composition converted to substantially pure silver at about 210° C. This example illustrates the use of excess conversion reaction inducing agent.

Example 3

A mixture of 1.7 grams terpineol and 1.7 grams silver trifluoroacetate was formed, corresponding to 0.69 moles of precursor to one mole of precursor. The mixture was subjected to TGA analysis, which showed that the mixture converted to substantially pure silver at 175° C. This mixture has a conversion temperature of 175° C. The molar ratio of salt to terpineol is 0.69 moles of salt to one mole of terpineol. This example illustrates a correct ratio of inducing agent to precursor.

Example 4 (Comparative Example)

A mixture containing 50 grams Ag-trifluoroacetate and 50 grams $H_2O$ was formulated. The calculated silver content was 24.4 wt. % and thermogravimetric analysis showed the mass loss reached 78 wt. % at 340° C. This data corresponds to the above-described decomposition temperature for pure Ag-trifluoroacetate, within a reasonable margin for error.

Example 5 (Preferred Additive)

A mixture was formulated containing 44 grams Ag-trifluoroacetate, 22 grams $H_2O$, 33 grams DEGBE and 1 part by weight lactic acid. The calculated silver content was 21.5 wt. % and thermogravimetric analysis showed the mass loss reached 79 wt. % at 215° C. The addition of DEGBE advantageously reduced the decomposition temperature by 125° C. compared to the formulation as described in Example 4. The lactic acid functions as a crystallization inhibitor.

Example 6 (Comparative Example)

A mixture was formulated containing 58 grams Ag-trifluoroacetate and 42 grams dimethylformamide. The calculated silver content was 21.5 wt. % and thermogravi metric analysis showed a mass loss of 78.5 wt. % at 335° C., a decomposition temperature similar to the formulation in Example 4.

Example 7 (Preferred Solvent, Comparative Example)

A mixture was formulated containing 64.8 grams Ag-trifluoroacetate, 34 grams DMAc and 1.1 grams of a styrene allyl alcohol (SM) copolymer binder. Thermogravimetric analysis showed that precursor decomposition to silver was complete at 275° C. The use of DMAc reduced the decomposition temperature by about 65° C. as compared to Example 4.

Example 8

A mixture was formulated containing 51 grams Ag-trifluoroacetate, 16 grams DMAc and 32 grams alpha terpineol. The calculated silver content was 25 wt. %. Thermogravimetric analysis showed a mass loss of 77 wt. % at 205° C. This decomposition temperature is decreased by 70° C. compared to the formulation described in Example 7, which does not employ terpineol as an additive.

Example 9

A mixture was formulated containing 33.5 grams Ag-trifluoroacetate, 11 grams DMAc, 2 grams lactic acid and 53.5 grams DEGBE. The calculated silver content was 16.3 wt. %. Thermogravimetric analysis showed a mass loss of 83 wt. % at 205° C. to 215° C. The decomposition temperature is decreased by 60° C. to 70° C. compared to the formulation described in Example 7, which does not employ DEGBE as an additive.

Example 10

A mixture was formulated containing 49.9 grams Ag-trifluoroacetate, 16.3 grams DMAc, 32.5 grams alpha-terpineol and 1.2 grams Pd-acetate. Thermogravimetric analysis indicated complete decomposition of the metal organic precursors at 170° C. This decomposition temperature is decreased by 35° C. compared to the formulation described in Example 8, which does not employ Pd-acetate as an additive.

Example 11

A mixture was formulated containing 47.3 grams Ag-trifluoroacetate, 50.4 grams DMAc and 2.4 grams Pd-acetate. Thermogravimetric analysis indicated complete decomposition of the metal organic precursors at 195° C. This decomposition temperature is 80° C. lower compared to the formulation described in Example 7, which does not employ Pd-acetate as an additive.

Example 12

A mixture was formulated containing 7.4 grams Ag-acetate and 92.6 grams ethanolamine. Thermogravimetric analysis showed that precursor decomposition to silver was complete at 190° C. This conversion temperature is 65° C. lower than the decomposition temperature of pure Ag-acetate.

Example 13a

A silver/palladium mixture was formulated containing 38.3 grams Ag-trifluoroacetate, 818.7 grams Pd-trifluoroacetate, 67.9 grams DMAc and 2.8. grams lactic acid. The targeted ratio of Ag/Pd was 40/60 by mass. The calculated Ag/Pd content was 10 wt. %. Thermogravimetric analysis showed a mass loss of 87 wt. % at 190° C. The presence of Pd-trifluoroacetate reduced the decomposition temperature by 80° C. compared to the composition described in Example 7.

Example 13b

A silver/palladium mixture was formulated containing 5.2 grams Ag-trifluoroacetate, 23.4 grams Pd-trifluoroacetate, 67.9 grams DMAc and 3.5 grams lactic acid. The targeted ratio of Ag/Pd was 25/75 by mass and the calculated Ag/Pd content was 10 wt. %. Thermogravimetric analysis showed a mass loss of 88 wt. % at 190° C. The presence of Pd-trifluoroacetate reduced the decomposition temperature by 80° C. compared to the composition described in Example 7.

Example 14 (Comparative Example)

A mixture was formulated containing 48.1 grams Ag-trifluoroacetate, 48.1 grams DMAc and 3.8 grams DEGBE. The mixture was deposited on a glass substrate and heated on a hotplate at 200° C. The resulting film showed large crystal growth and was not conductive.

Example 15

A mixture was formulated containing 2.5 grams Ag-trifluoroacetate, 2.5 grams DMAc and 0.2 grams lactic acid. The mixture was deposited on a glass substrate and fired on a hotplate at 200° C. The resulting film showed reduced crystal growth.

EXAMPLES OF IN-SITU PRECURSOR GENERATION

Example 16 (Comparative Example)

Silver oxide (AgO) powder was tested using TGA at a constant heating rate of 10° C./min. The TGA showed the conversion to pure silver was complete by about 460° C.

Example 17

A mixture of 3.2 grams silver oxide and 3.0 grams neodecanoic acid was analyzed in a TGA. The analysis demonstrated that the conversion to pure silver was substantially complete by about 250° C.

Example 18

A mixture of 5.2 grams alpha terpineol, 4.9 grams silver oxide and 1.1 grams neodecanoic acid was analyzed in a TGA. The TGA demonstrated that the conversion to pure silver was substantially complete by about 220° C.

Example 19

The silver oxide/carboxylic acid chemistry was modified by the addition of metallic silver powder. The reaction products from the silver oxide and carboxylic acid weld the silver particles together providing highly conductive silver traces and features.

Specifically, a mixture of 24.4 grams of metallic silver flake, 0.6 grams neodecanoic acid, 3.7 grams alpha terpineol and 1.5 grams silver oxide was heated in a TGA. The conversion to pure silver was complete by 220° C. When fired on a surface, this produced a feature having a resistivity of about 5 times the resistivity of bulk silver.

Lowering the Conversion Temperature by Use of Palladium Precursors

Example 20 (Comparative Example)

A mixture of 80 grams metallic silver powder, 10 grams silver trifluoroacetate, 3.51 grams DMAc, 6.99 grams alpha terpineol, 0.1 gram ethyl cellulose and 0.1 gram SOLSPERSE 21000 (SOURCE?) was analyzed using TGA. The mixture converted to substantially pure silver at about 220° C. The same mixture was deposited and heated to 250° C. The resulting conductive feature had a resistivity of 6.7 times the bulk resistivity of pure silver.

Example 21

A mixture of 80 grams metallic silver powder, 9.0 grams silver trifluoroacetate, 1.0 gram palladium acetate, 3.17 grams DMAc, 6.35 grams alpha terpineol, 0.2 grams ethyl cellulose and 0.2 grams Solsperse 21000 was analyzed in a TGA. The TGA analysis showed the conversion to substantially pure silver was complete by about 160° C. The mixture was deposited and heated to 250° C. for 10 minutes. The resulting conductive feature had a resistivity of 16.8 times the bulk resistivity of pure silver.

Example 22

A mixture of 3.17 grams DMAc, 6.35 grams alpha terpineol, 0.2 grams ethyl cellulose, 0.2 grams SOLSPERSE 21000, 9 grams silver trifluoroacetate, 80 grams metallic silver powder and 1.0 gram palladium trifluoroacetate was analyzed using TGA. This mixture showed a conversion to substantially pure silver at about 160° C. This mixture was then deposited and heated to 250° C. for 10 minutes. The resulting conductive feature had a resistivity of 4.2 times the bulk resistivity of pure silver.

EXAMPLES OF SILVER HIGH VISCOSITY PRECURSOR COMPOSITIONS

Example 23

A precursor composition was formulated including 16.5 grams metallic silver powder, 3.5 grams alpha-terpineol and 5 grams silver carbonate. This composition was deposited and heated to 350° C. The resulting conductive feature had a resistivity of 29 times the bulk resistivity of pure silver.

Example 24

A precursor composition was formulated including 10 grams silver oxide, 0.9 grams silver nitrate, 20 grams metallic silver powder, 2.1 grams DMAc and 5.0 grams terpineol. The composition was deposited and heated to 350° C. The resulting conductive feature had a resistivity of about 11 times the bulk resistivity of silver.

Example 25

A precursor composition was formulated including 77.3 grams silver powder, 32.5 grams silver trifluoracetate, 1.2 grams SOLSPERSE 21000 and 16.2 grams alpha terpineol. The composition was deposited and heated to 250° C. The resulting conductive feature had a resistivity that was less than 6 times the bulk resistivity of pure silver. The material was very dense and non-porous. This is an example of a composition where the silver molecular precursor was not dissolved in a solvent. In this mixture, the silver precursor was in a crystalline state insterspersed amongst the particles of silver. This mixture was also tested using TGA and showed a conversion to silver at about 177° C.

Example 26

A precursor composition was formulated that included 102.9 grams silver powder, 7.8 grams silver oxide, 15.2 grams silver nitrate, 10.1 grams terpineol and 1.5 grams SOLSPERSE 21000. The precursor composition was deposited and was heated to 250° C. The resulting conductive features had a resistivity that was less than 6 times the bulk resistivity of pure silver. The material was very dense and had low porosity. This mixture was analyzed in a TGA and showed a conversion to silver at about 270° C.

Example 27

A precursor composition was formulated including 54.5 grams of a highly spherical silver/silica composite powder, 0.25 grams styrene allyl alcohol (SAA), 2.25 grams DMAc, 0.1 grams SOLSPERSE 21000, 0.05 grams ethyl cellulose, 4.35 grams alpha terpineol and 6 grams of silver trifluoroacetate. This precursor composition was capable of being dispensed through a syringe orifice having a 75 $\mu$m outer diameter and a 50 $\mu$m inner diameter. When heated to 850° C., the composition produced conductive features having a resistivity of 1.1 times the bulk resistivity of pure silver.

EXAMPLES OF COPPER MOLECULAR PRECURSOR FORMULATIONS

Example 28

An almost saturated copper precursor mixture containing Cu-formate in water and less than 1.0 wt. % glycerine was formulated. Thermogravimetric analysis (either in air, forming gas or nitrogen) indicated decomposition of the precursor to copper at a temperature of about 230° C. XRD analysis of the TGA residue shows the formation of pure copper. Higher temperatures or prolonged treatment at the conversion temperature will lead to the formation of copper oxide if not protected from moisture or ambient air. However, other treatments such as laser conversion can be carried out to obtain precursor conversion to pure copper even in ambient air without the formation of copper oxide.

EXAMPLES OF COPPER/SILVER PRECURSOR COMPOSITIONS

Example 29 (Comparative Example)

A precursor composition was formulated using 40.8 grams spherical copper powder, 10.1 grams silver trifluoroacetate, 4.9 grams DMAc, and 1.5 grams terpineol. The precursor composition was doctor bladed onto a glass slide to form a narrow line. The precursor composition was heated in air at 250° C. for 12 minutes. The resulting feature was a dark brown line with very poor adhesion to the glass substrate. The feature did not show any significant conductivity. This is an example of a precursor composition with copper particles and a silver molecular precursor that does not conduct when fired in air. TGA analysis indicated that oxidation of the copper particles occurred at 170° C.

Example 30

A precursor composition was formulated from 40.8 grams spherical copper powder, 10.1 grams silver trifluoroacetate, 4.9 grams DMAc, and 1.5 grams terpineol. The precursor composition was doctor bladed onto a glass slide to form feature in the shape of a narrow line. The feature was heated in pure nitrogen at 350° C. for 12 minutes. The metal line showed a resistivity after heating of 24 times the bulk resistivity of pure copper. This is an example of a precursor composition with copper particles and a silver molecular precursor that shows good conductivity when fired in the absence of oxygen

EXAMPLES OF SILVER/PALLADIUM PRECURSOR COMPOSITIONS

Example 31 (Comparative Example)

A precursor composition was formulated using 80 grams spherical silver powder, 9.0 grams silver trifluoroacetate, 3.17 grams DMAc, and 6.35 grams alpha terpineol. The precursor composition was doctor bladed onto a glass slide to form a feature in the shape of a narrow line. The feature was then heated in air at 250° C. for 10 minutes. The metal feature was subsequently dipped in liquid solder at 250° C. for 15 seconds. The solder dipping treatment reduced the width of the line by about 15%.

Example 32

A precursor composition was formulated using 80 grams of spherical silver powder, 9.0 grams silver trifluoroacetate, 1.0 grams palladium trifluoroacetate, 3.17 grams DMAc, and 6.35 grams alpha terpineol. The precursor composition was doctor bladed onto a glass slide to form a feature in the form of a narrow line. The feature was heated in air at 250° C. for 10 minutes. The metal line was subsequently dipped in liquid solder at 250° C. for 15 seconds. The solder dip did not have any significant effect on the width of the deposited line, indicating good solder leach resistance.

Examples 31 and 32 illustrate that the formulation with the small amount of Pd molecular precursor exhibits a significant improvement in solder leach resistance as compared to the formulation without palladium precursor.

What is claimed is:

1. A method for the fabrication of a conductive feature on a substrate, comprising the steps of:
   (a) providing a precursor composition comprising a metal precursor compound, wherein said precursor composition has a viscosity of at least about 1000 centipoise;
   (b) depositing said precursor composition on a substrate; and
   (c) heating said precursor composition to a conversion temperature of not greater than about 2000° to form a conductive feature, wherein said conductive feature has a resistivity of not greater than about 10 times the resistivity of the pure bulk metal.

2. A method as recited in claim 1, wherein said viscosity is at least about 5000 centipoise.

3. A method as recited in claim 1, wherein said conductive feature has a minimum feature size of not greater than about 100 μm.

4. A method as recited in claim 1, wherein said metal precursor compound comprises silver.

5. A method as recited in claim 1, wherein said metal precursor compound is a metal carboxylate compound.

6. A method as recited in claim 1, wherein said metal precursor compound is a silver halogenocarboxylate precursor compound.

7. A method as recited in claim 1, wherein said metal precursor compound is silver trifluoroacetate.

8. A method as recited in claim 1 wherein said precursor composition further comprises a crystallization inhibitor.

9. A method as recited in claim 1, wherein said precursor composition further comprises a vehicle.

10. A method as recited in claim 1, wherein said precursor composition further comprises metallic particles.

11. A method as recited in claim 1, wherein said precursor composition further comprises metallic nanoparticles.

12. A method as recited in claim 1, wherein said deposition step comprises screen printing.

13. A method as recited in claim 1, wherein said conversion temperature is not greater than about 185° C.

14. A method as recited in claim 1, wherein said heating step is performed using a laser.

15. A method as recited in claim 1, wherein said heating step is performed using a furnace.

16. A method as recited in claim 1, wherein said conductive feature has a resistivity of not greater than about 6 times the pure bulk metal.

17. A method as recited in claim 1, wherein said conductive feature has a resistivity of not greater than about 4 times the pure bulk metal.

18. A method as recited in claim 1, wherein said conductive feature has a resistivity of not greater than about 2 times the pure bulk metal.

19. A method as recited in claim 1, wherein said substrate is selected from the group consisting of polyfluorinated compounds, polyimides, epoxies, polycarbonate, cellulose-based materials, acetate, polyester, polyethylene, polypropylene, polyvinyl chloride, acrylonitrile-butadiene-styrene, flexible fiber board, non-woven polymeric fabric and cloth.

20. A method as recited in claim 1, wherein said precursor composition further comprises a polymer.

21. A method for the fabrication of a conductive feature on a substrate, said comprising the steps of:
   (a) providing a precursor composition comprising an inorganic silver precursor compound and silver particles, wherein said precursor composition has a viscosity of at least about 1000 centipoise;
   (b) depositing said precursor composition onto said substrate; and
   (c) heating said precursor composition to a conversion temperature of not greater than about 350° C. to form a conductive feature having a resistivity of not greater than about 10 times the resistivity of bulk silver.

22. A method as recited in claim 21, wherein said conversion temperature is not greater than about 250° C.

23. A method as recited in claim 21, wherein said conversion temperature is not greater than about 200° C.

24. A method as recited in claim 21, wherein said conversion temperature is not greater than about 185° C.

25. A method as recited in claim 21, wherein said inorganic silver precursor compound is selected from the group consisting of silver oxides, silver nitrates, silver oxalates and silver nitrites.

26. A method as recited in claim 21, wherein said precursor composition further comprises terpineol.

27. A method as recited in claim 21, wherein said silver particles comprise silver nanoparticles.

28. A method as recited in claim 21, wherein said silver particles comprises silver flakes.

29. A method as recited in claim 21, wherein said conductive feature has a resistivity that is not greater than about 6 times the resistivity of bulk silver.

30. A method as recited in claim 21, wherein said conductive feature has a resistivity that is not greater than about 4 times the resistivity of bulk silver.

31. A method as recited in claim 21, wherein said substrate is an organic substrate.

32. A method as recited in claim 21, wherein said substrate is a polymer.

33. A method as recited in claim 21, wherein said substrate is polyimide.

* * * * *

UNITED STATES PATENT AND TRADEMARK OFFICE
CERTIFICATE OF CORRECTION

PATENT NO. : 6,951,666 B2
DATED : October 4, 2005
INVENTOR(S) : Kodas et al.

It is certified that error appears in the above-identified patent and that said Letters Patent is hereby corrected as shown below:

Column 47,
Line 43, delete "2000º" and insert -- 200º C --.

Column 48,
Line 28, after "said", insert -- method --.

Signed and Sealed this

Third Day of January, 2006

JON W. DUDAS
*Director of the United States Patent and Trademark Office*